(12) United States Patent
Ohmi et al.

(10) Patent No.: US 8,575,023 B2
(45) Date of Patent: Nov. 5, 2013

(54) CONTACT FORMATION METHOD, SEMICONDUCTOR DEVICE MANUFACTURING METHOD, AND SEMICONDUCTOR DEVICE

(75) Inventors: Tadahiro Ohmi, Sendai (JP); Akinobu Teramoto, Sendai (JP); Tatsunori Isogai, Sendai (JP); Hiroaki Tanaka, Sendai (JP)

(73) Assignees: National University Corporation Tohoku University, Miyagi (JP); Foundation for Advancement of International Science, Ibaraki (JP)

( * ) Notice: Subject to any disclaimer, the term of this patent is extended or adjusted under 35 U.S.C. 154(b) by 110 days.

(21) Appl. No.: 13/126,249

(22) PCT Filed: Oct. 23, 2009

(86) PCT No.: PCT/JP2009/068233
§ 371 (c)(1),
(2), (4) Date: Apr. 27, 2011

(87) PCT Pub. No.: WO2010/050405
PCT Pub. Date: May 6, 2010

(65) Prior Publication Data
US 2011/0198702 A1  Aug. 18, 2011

(30) Foreign Application Priority Data
Oct. 30, 2008  (JP) .................................. 2008-279536

(51) Int. Cl.
*H01L 21/52* (2006.01)
(52) U.S. Cl.
USPC .... 438/652; 438/651; 257/407; 257/E21.637; 257/E29.116

(58) Field of Classification Search
USPC ........... 438/651; 257/E21.623, E29.116, 407, 257/E21.637
See application file for complete search history.

(56) References Cited

U.S. PATENT DOCUMENTS

| | | | |
|---|---|---|---|
| 2002/0111018 A1 | 8/2002 | Tai | |
| 2003/0045098 A1* | 3/2003 | Verhaverbeke et al. | ...... 438/689 |
| 2003/0209715 A1 | 11/2003 | Ikeda et al. | |
| 2004/0080001 A1 | 4/2004 | Takeuchi | |
| 2005/0139926 A1 | 6/2005 | Shimizu et al. | |

(Continued)

FOREIGN PATENT DOCUMENTS

| | | |
|---|---|---|
| GB | 2347789 | 9/2000 |
| JP | 11-26397 | 1/1999 |

(Continued)

OTHER PUBLICATIONS

Translation of JP2003-249660 (Sep. 2003) 46 pages.*

(Continued)

*Primary Examiner* — Caridad Everhart
(74) *Attorney, Agent, or Firm* — Morgan, Lewis & Bockius LLP

(57) ABSTRACT

A semiconductor device manufacturing method which achieves a contact of a low resistivity is provided.
In a state where a first metal layer in contact with a semiconductor is covered with a second metal layer for preventing oxidation, only the first metal layer is silicided to form a silicide layer with no oxygen mixed therein. As a material of the first metal layer, a metal having a work function difference of a predetermined value from the semiconductor is used. As a material of the second metal layer, a metal which does not react with the first metal layer at an annealing temperature is used.

51 Claims, 14 Drawing Sheets

(56) References Cited

U.S. PATENT DOCUMENTS

| | | |
|---|---|---|
| 2006/0051961 A1* | 3/2006 | Cabral et al. ............... 438/664 |
| 2006/0071291 A1* | 4/2006 | Yagishita .................... 257/471 |
| 2006/0134848 A1 | 6/2006 | Lander et al. |
| 2006/0163670 A1* | 7/2006 | Ellis-Monaghan et al. .. 257/388 |
| 2006/0211244 A1* | 9/2006 | Deshpande et al. ......... 438/682 |
| 2006/0258154 A1* | 11/2006 | Sandhu et al. .............. 438/649 |
| 2006/0273409 A1* | 12/2006 | Lee et al. ..................... 257/407 |
| 2007/0052039 A1 | 3/2007 | Iinuma et al. |
| 2008/0014666 A1* | 1/2008 | Takayama et al. ............ 438/30 |
| 2008/0191285 A1* | 8/2008 | Ko et al. ...................... 257/369 |
| 2008/0251855 A1* | 10/2008 | Besser ......................... 257/377 |
| 2009/0011537 A1* | 1/2009 | Shimizu et al. .............. 438/104 |
| 2009/0057788 A1* | 3/2009 | Hattendorf et al. .......... 257/412 |
| 2009/0129174 A1* | 5/2009 | Madurawe ............... 365/189.08 |
| 2010/0059830 A1 | 3/2010 | Ohmi et al. |

FOREIGN PATENT DOCUMENTS

| | | | |
|---|---|---|---|
| JP | 2000-252370 | 9/2000 | |
| JP | 2001-015453 | 1/2001 | |
| JP | 2003-249660 | * 9/2003 | ............ H01L 21/336 |
| JP | 2003-332259 | 11/2003 | |
| JP | 2005-191354 A | 7/2005 | |
| JP | 2007-067225 | 3/2007 | |
| JP | 2008-529302 | 7/2008 | |
| KR | 10-2005-009447 A | 9/2005 | |
| WO | 2008/007748 | 1/2008 | |

OTHER PUBLICATIONS

Office Action mailed Nov. 23, 2012 in the corresponding Korean Application No. 10-2012-7024359.

* cited by examiner (A)

(B)

CONTACT FORMATION METHOD, SEMICONDUCTOR DEVICE MANUFACTURING METHOD, AND SEMICONDUCTOR DEVICE

This is a U.S. National Phase Entry of PCT Application No. PCT/JP2009/068233, filed Oct. 23, 2009, with a priority date of Oct. 30, 2008, based upon Japanese Patent Application No. 2008-279536.

TECHNICAL FIELD

This invention relates to an MIS semiconductor device widely used in an IC, an LSI, and the like and, in particular, to a structure of a source/drain electrode and/or a structure of a gate electrode.

BACKGROUND ART

In a semiconductor device, performance improvement, such as improvement in operating frequency, has been strongly desired. However, in the semiconductor device, a series resistance between two main electrodes, through which an electric current mainly flows, impedes the performance improvement. Patent Document 1 describes the necessity of reducing the series resistance and, specifically, the necessity of substantially reducing a contact resistance between a semiconductor region and an electrode.

Patent Document 1 proposes to use, as a material of an electrode contacting an $n^+$ silicon region, Er, Mg, Mn, Cd, Hf, Y, or Zr each having a work function close to $-4.05$ eV which is a work function of the $n^+$ silicon region, and to use, as a material of an electrode contacting a $p^+$ silicon region, Pd, Pt, Co, Ni, or Ir each having a work function close to $-5.15$ eV which is a work function of the $p^+$ silicon region.

However, Patent Document 1 does not sufficiently clarify which of the above-mentioned materials is practically preferable. Further, according to the knowledge of the present inventors, oxygen is inevitably mixed into a silicide and a gate metal during heat treatment for silicide formation or the like at a contact portion. This results in a problem that an increase of a resistance of the contact silicide or the gate metal is inevitable.

PRIOR ART DOCUMENT

Patent Document

Patent Document 1: International Publication No. WO2008/007748

SUMMARY OF THE INVENTION

Problem to be Solved by the Invention

Therefore, an object of the present invention is to provide a contact formation method suitable for practical use.

Another object of the present invention is to provide a semiconductor device in which oxygen is prevented from being mixed into a contact silicide and a gate electrode metal.

Means to Solve the Problem

According to a first aspect of the present invention, there is provided a method of forming a contact of a metal semiconductor compound on a predetermined region of a semiconductor device, characterized by comprising the steps of forming a layer of a first metal on the predetermined region, forming, on the layer of the first metal, a layer of a second metal for preventing oxidation of the first metal, and compounding only the first metal with a semiconductor by heat treatment, wherein, when the predetermined region is an n-type semiconductor region, the first metal is formed by a metal which has a work function whose absolute value is smaller than a value obtained by adding 0.3 eV to an absolute value of an energy level at the bottom of a conduction band of the semiconductor and wherein, when the predetermined region is a p-type semiconductor region, the first metal is formed by a metal which has a work function whose absolute value is greater than a value obtained by subtracting 0.3 eV from an absolute value of an energy level at the top of a valence band of the semiconductor. Herein, the semiconductor may include Si, Ge, SiGe, SiC, and the like.

According to a second aspect of the present invention, there is provided a semiconductor device manufacturing method characterized by comprising he steps of forming a layer of a first metal at a silicon portion to be a p-type or an n-type contact region of a semiconductor device, forming, on the layer of the first metal, a layer of a second metal for preventing oxidation of the first metal, and forming a silicide of the first metal by reacting only the first metal with the silicon portion, wherein, when the contact region is of an n-type, a metal which is selected and used as the first metal has a work function whose absolute value is smaller than a value obtained by adding 0.3 eV to an absolute value of an energy level at the bottom of a conduction band of silicon and wherein, when the contact region is of a p-type, the metal which is selected and used as the first metal has a work function whose absolute value is greater than a value obtained by subtracting 0.3 eV from an absolute value of an energy level at the top of a valence band of silicon.

According to a third aspect of the present invention, there is provided a semiconductor device characterized by comprising a silicide layer of a silicide of a first metal formed on a surface of a silicon portion as a p-type or an n-type contact region of the semiconductor device, wherein, when the contact region is of the n-type, the silicide layer is formed by the first metal which has a work function whose absolute value is smaller than a value obtained by adding 0.3 eV to an absolute value of an energy level at the bottom of a conduction band of silicon, wherein, when the contact region is of the p-type, the silicide layer is formed by the first metal which has a work function whose absolute value is greater than a value obtained by subtracting 0.3 eV from an absolute value of an energy level at the top of a valence band of silicon; and wherein the amount of mixed oxygen in the silicide layer is 1 mass % or less.

Effect of the Invention

According to the present invention, it is possible to form a practical contact having a low contact resistivity. Further, according to the present invention, it is possible to prevent oxygen from being mixed during silicidation.

MODE FOR EMBODYING THE INVENTION

Before describing embodiments of the present invention, at first referring to FIGS. 1 and 2, description will be made of a contact structure according to the present invention and characteristics of contact metals constructing the contact structure, and so on.

Figure 1:
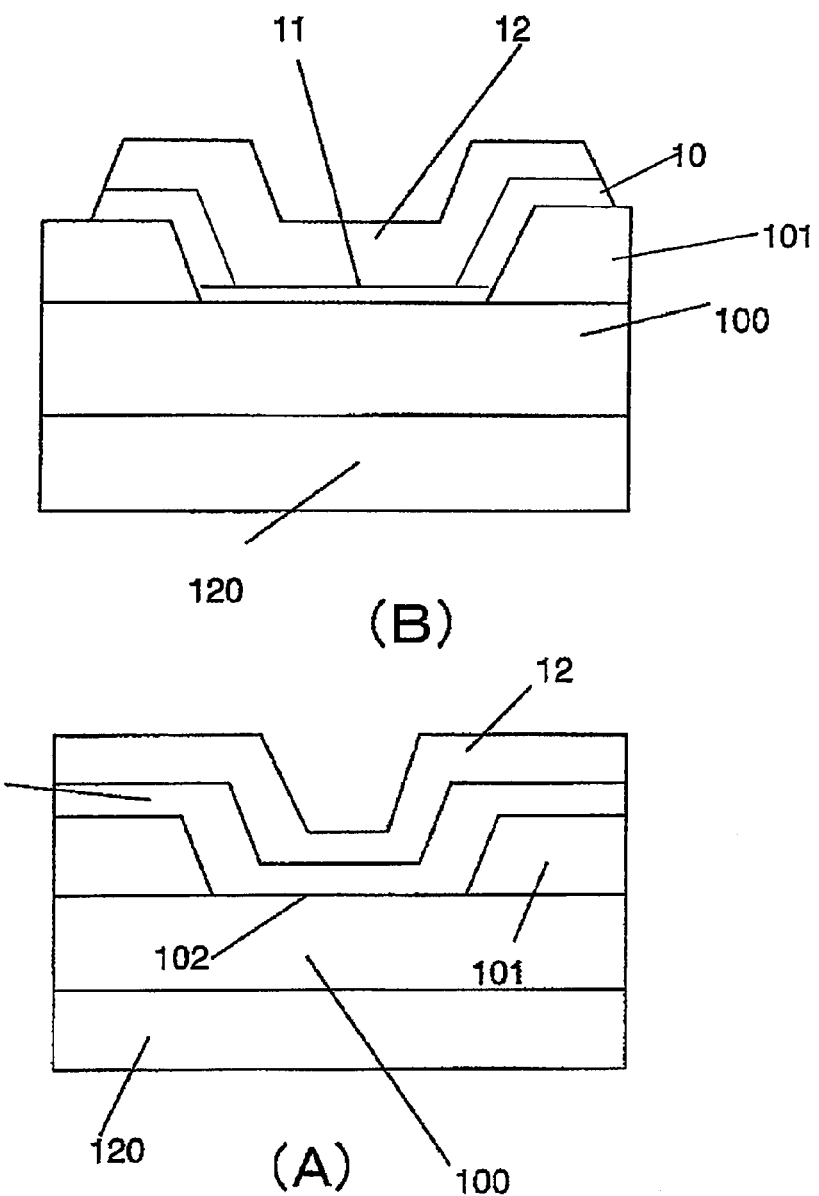
FIG. 1 shows, in (A) and (B), schematic structural views for describing a structure and a manufacturing process for the purpose of describing the present invention.

First, as shown in FIG. 1 (A), on one surface of a silicon substrate 100, an insulating film 101 is formed. A back surface of the silicon substrate 100 is provided with a semiconductor-side electrode 120 formed of aluminum or the like. As the silicon substrate 100, a p-type one and an n-type one are separately prepared and used. Each of the silicon substrates 100 has a low-impurity concentration of $1\times10^{15}$ cm$^{-3}$. Although a contact region in an actual device has a higher impurity concentration, such a low concentration is used herein for the purpose of measuring a work function of a contact metal silicide.

Next, in the insulating film 101 formed on the surface of the silicon substrate 100, an opening portion 102 is formed. As a consequence, the silicon substrate 100 is selectively exposed at the opening portion 102. The exposed portion (contact region) has an area of $1\times10^{-3}$ cm$^2$. Processes of exposing and cleaning the silicon substrate 100 are performed in a high-purity nitrogen atmosphere and the silicon substrate is delivered to a metal forming device (not shown in the figure) without being exposed to air. As described above, the substrate is delivered in the high-purity nitrogen atmosphere without being exposed to air. Therefore, it is possible to suppress growth of a natural oxide film on the surface of the silicon substrate 100 before a low-work-function metal film is formed.

Subsequently, on the silicon substrate 100, a low-work-function metal layer 10 is formed in the metal forming device. In order to minimize mixture of impurities, sputtering is desirably used as a metal forming method. A metal material for forming the low-work-function metal layer 10 is selected from metal materials each of which forms, with the silicon substrate 100, a metal silicide and has a specific work function with respect to the silicon substrate 100.

Figure 16:
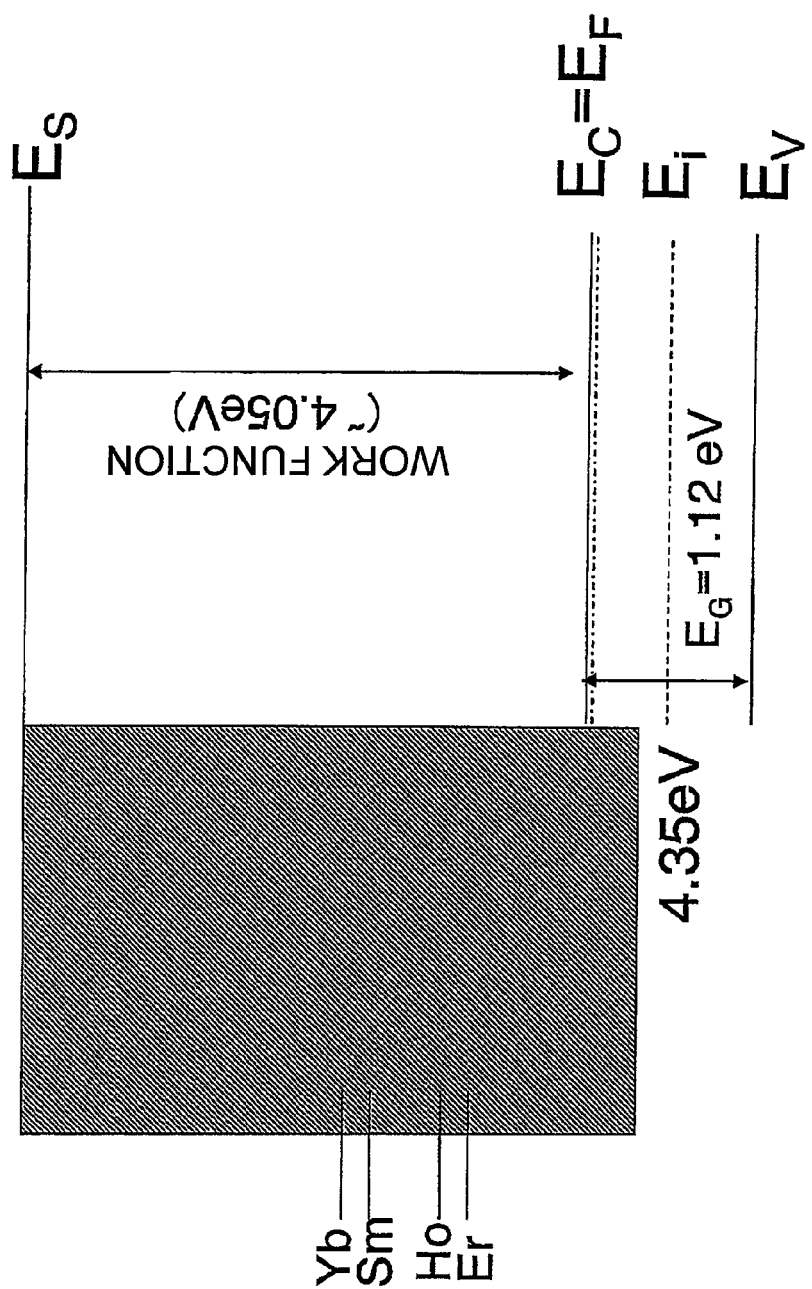
FIG. 16 is a view for describing a work function of a metal material suitable for forming a contact region with an n-type silicon region.

Herein, referring to FIGS. 16 and 17, a metal material to be selected will be described separately in cases where the silicon substrates 100 illustrated in FIG. 1 (A) is n-type silicon and p-type silicon. FIG. 16 shows a band structure of the n-type silicon. As shown in FIG. 16, the n-type silicon has an energy level (Ev) of 5.17 eV at the top of a valence band, an energy level (Ec) of 4.05 eV at the bottom of a conduction band, and an intrinsic level (Ei) of 4.61 eV. An energy gap (EG) between the top of the valence band and the bottom of the conduction band is 1.12 eV. A work function of the n-type silicon is represented by an energy difference between a Fermi level and a vacuum level (Es). The Fermi level ($E_F$) of the n-type silicon is equal to the energy level (Ec) at the bottom of the conduction band and is about 4.05 eV. As a metal material used in the present invention, a metal material is selected which has a work function whose absolute value is smaller than a value (specifically, 4.35 eV) obtained by adding 0.3 eV to an absolute value (4.05 eV) of an energy (Ec) at the bottom of the conduction band. Specifically, a metal material having a work function in a region indicated by hatched lines in FIG. 16, for example, a rare-earth metal, such as erbium (Er: its work function being 3.2 eV), holmium (Ho: its work function being 3.1 eV), samarium (Sm: its work function being 2.7 eV), or ytterbium (Yb: its work function being 2.6 eV), is selected.

Figure 17:
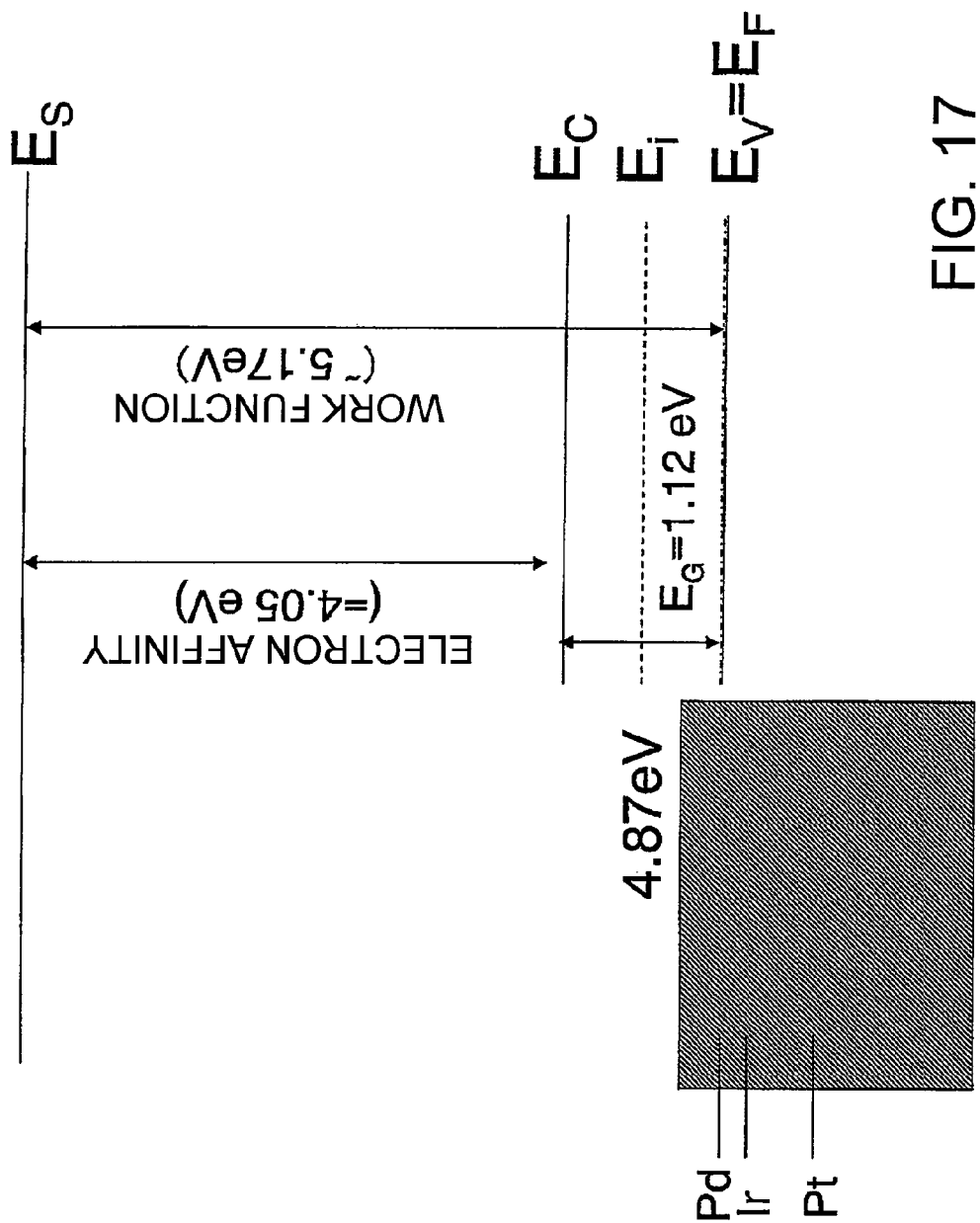
FIG. 17 is a view for describing a work function of a metal material suitable for forming a contact region with a p-type silicon region.

On the other hand, FIG. 17 shows a band structure of the p-type silicon. The p-type silicon has, like the n-type silicon, an energy level (Ev) of 5.17 eV at the top of a valence band, an energy level (Ec) of 4.05 eV at the bottom of a conduction band, and an intrinsic level (Ei) of 4.61 eV. An energy gap (EG) between the top of the valence band and the bottom of the conduction band is 1.12 eV. However, a work function of the p-type silicon is represented by an energy difference between a Fermi level and a vacuum level (Es). The Fermi level ($E_F$) of the p-type silicon is equal to the energy level (Ev) at the top of the valence band and is about 5.17 eV. A metal material used for forming a contact with the p-type silicon in the present invention is selected from metal materials having a work function whose absolute value is greater than a value (specifically, 4.87 eV) obtained by subtracting 0.3 eV from an absolute value (5.17 eV) of an energy level at the top of the valence band of silicon. Specifically, a material having a work function in a region indicated by hatched lines in FIG. 17, for example, palladium (Pd: 4.9 eV), iridium (Ir: 5.35 eV), or platinum (Pt: 5.65 eV), is selected.

For the purpose of reducing the amount of silicon consumption of the silicon substrate 100, use may be made of, as a sputtering target, a silicide of a rare-earth metal which has, when the silicon substrate 100 is of the n-type, a work function whose absolute value is smaller than a value obtained by adding 0.3 eV to an absolute value of the energy level at the bottom of the conduction band of silicon and which has, when the silicon substrate is of the p-type, a work function whose absolute value is greater than a value obtained by subtracting 0.3 eV from an absolute value of the energy level at the top of the valence band.

Referring back to FIG. 1 (A), the silicon substrate 100 with the low-work-function metal layer 10 formed thereon is delivered in an inactive gas atmosphere, such as reduced-pressure nitrogen or argon, so as not to be exposed to air, to a second metal film forming chamber where an oxidation-resistant metal layer 12 is formed. As the oxidation-resistant metal layer 12, tungsten (W) is desirably used but other elemental metals and a compound, such as a metal nitride, may be used also. In any case, a material must be resistant to a high temperature during silicidation.

Subsequently, a heat treatment is performed at 600° C. to cause solid-phase reaction of the low-work-function metal layer 10 with the silicon substrate 100 so that a silicide layer 11 is formed as shown in FIG. 1 (B). The low-work-function metal layer 10 on the insulating film 101 is not silicided and remains unreacted on the insulating film 101.

The heat treatment for forming the silicide layer 11 may be performed by a clustered heat treatment device including the film forming device for the low-work-function metal layer 10 and a film forming device for the oxidation-resistant metal layer 12. Actually, however, oxidation of the underlying low-work-function metal layer 10 can be prevented due to the effect of the oxidation-resistant metal layer 12, even if the substrate is delivered in air. Therefore, the substrate may be delivered out of the film forming device and treated by another heat treatment device. As an atmosphere during the heat treatment, an inactive gas atmosphere, such as high purity nitrogen or argon, is desirable.

After the silicide layer 11 is formed, the oxidation-resistant metal layer 12 except a predetermined pattern and the unreacted low-work-function metal layer on the insulating film 101 are removed. Thereafter, sintering may be performed in a dilute hydrogen atmosphere.

The structure shown in FIG. 1 can be used as a contact structure if the contact region of the silicon substrate is a high-concentration n-type region. In this event, since the oxidation-resistant metal layer 12 is laminated on the low-work-function metal layer 10, the oxidation-resistant metal layer 12 can be used directly as an upper electrode of the semiconductor device. Thus, the oxidation-resistant metal layer 12 illustrated in the figure can also be used as the upper electrode.

Figure 2:
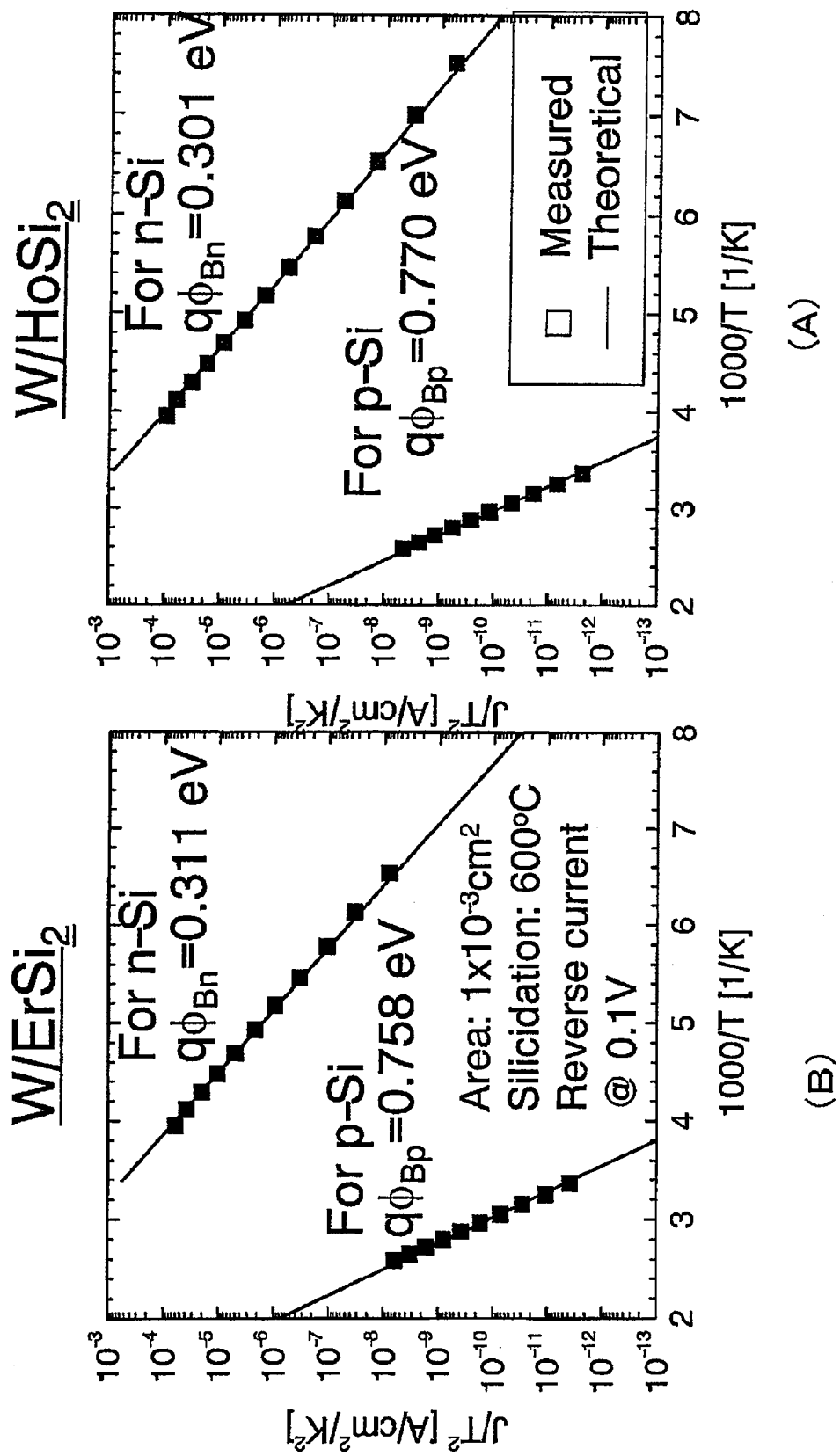
FIG. 2 shows characteristics when holmium and erbium are used in a contact portion shown in FIG. 1, respectively.

Referring to FIG. 2, temperature characteristics of the structure (may be called a Schottky diode) illustrated in FIG. 1 are shown. In FIG. 2, the temperature characteristics appearing when the silicide layers 11 (specifically, $HoSi_2$ and $ErSi_2$) are formed by a silicide of holmium (Ho) or erbium (Er) and silicon are shown as FIGS. 2 (A) and (B), respectively. In this example, as the oxidation-resistant metal layer 12, a tungsten layer is used and, as each of the p-type and the n-type silicon substrates, a silicon substrate having an impurity concentration of $1 \times 10^{15}$ cm$^{-3}$ is used.

From inclinations of the characteristics with respect to the p-type and the n-type silicon substrates, which are shown in FIGS. 2 (A) and (B), respectively, it is found that a holmium (Ho) silicide has a barrier height as low as 0.301 eV with respect to electrons and an erbium (Er) silicide similarly has a barrier height as low as 0.311 eV with respect to electrons. Holmium (Ho) provides a lower barrier height as compared with erbium (Er).

As described above, the holmium (Ho) silicide and the erbium (Er) silicide have the low barrier height with respect to the n-type silicon. Therefore, a contact resistance with respect to the n-type high-concentration region can be reduced to a very small value of $1 \times 10^{-9}$ $\Omega$cm$^2$ or less.

Herein, an effect of the tungsten (W) layer formed as the oxidation-resistant metal layer 12 will be described.

Figure 3:
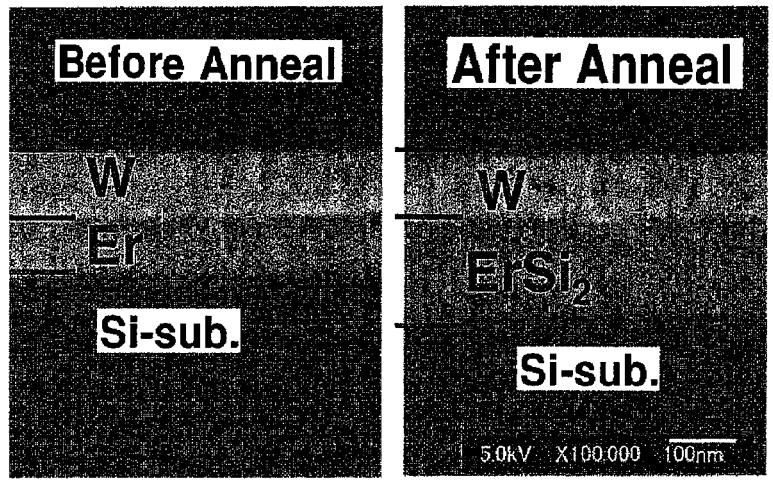
FIG. 3 shows, in (A) and (B), a laminated structure comprising an erbium layer and a tungsten layer formed on a silicon substrate, in the states before and after annealing, respectively.

Referring to FIGS. 3 (A) and (B), a SEM image of a section in a state where an erbium (Er) layer and the tungsten (W) layer are deposited on the silicon substrate and a SEM image of the section in a case where annealing is performed after the W layer is formed are shown, respectively. In the state of FIG. 3 (A), each of the erbium layer and the tungsten layer had a film thickness of 100 nm.

As apparent from comparison between FIGS. 3 (A) and (B), it is found that silicidation reaction is caused to occur between the silicon substrate and the erbium (Er) layer and, as a result, a film thickness of erbium is increased and an erbium silicide ($ErSi_2$) is formed. On the other hand, a film thickness of the tungsten (W) layer is not changed at all. This indicates that the tungsten layer has an oxidation-resistant function for the underlying erbium layer.

Figure 4:
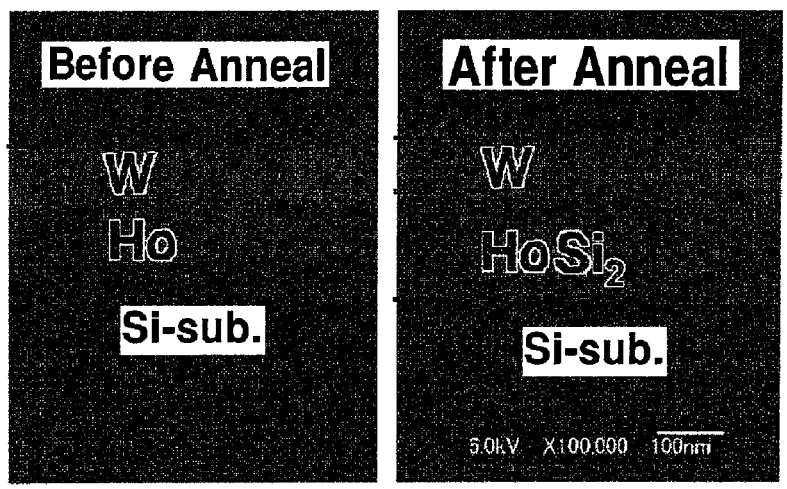
FIG. 4 shows, in (A) and (B), a laminated structure comprising a holmium layer and a tungsten layer formed on a silicon substrate, in the states before and after annealing, respectively.

Likewise, referring to FIGS. 4 (A) and (B), a section in a state where a holmium (Ho) layer and a tungsten (W) layer are deposited on the silicon substrate and the section in a case where annealing is performed after the W layer is formed are shown, respectively. In the state of FIG. 4 (A), each of the holmium layer and the tungsten layer had a film thickness of 100 nm.

As apparent from comparison between FIGS. 4 (A) and (B), silicidation reaction is caused to occur between silicon and holmium to form a holmium silicide layer. On the other hand, a film thickness of the tungsten layer is not changed at all. This indicates that the tungsten layer has an oxidation-resistant function of preventing oxidation of the holmium layer.

Thus, it is understood that the tungsten layer serves as an oxidation-resistant layer for preventing oxidation of the low-work-function metal layer formed of rare-earth metal.

Figure 5:
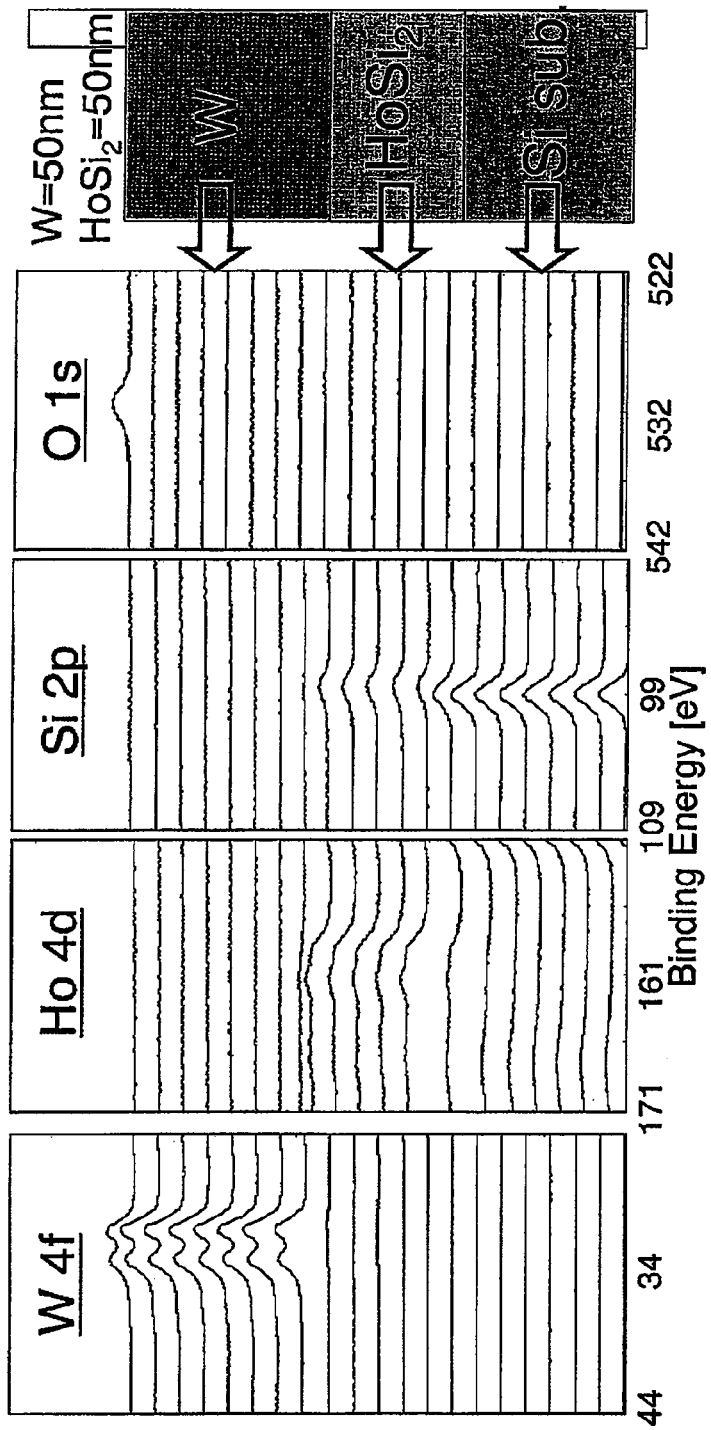
FIG. 5 shows XPS images representative of the result of a depth profile analysis when the holmium layer shown in FIG. 4 is silicided.

Next, referring to FIG. 5, for the purpose of further clarification of the function of the tungsten layer as the oxidation-resistant layer, the results of analysis by XPS are shown. In the example illustrated in the figure, the results of analysis are obtained in a case where a holmium silicide layer ($HoSi_2$) of 50 nm and a tungsten layer (W) of 50 nm are formed on a silicon substrate (Sisub) as shown in the right end in FIG. 5. This example is the result of depth profile analysis in a case where, after the holmium layer and the tungsten layer are deposited, annealing is performed at 500° C. for 10 minutes.

FIG. 5 shows the results of analysis of tungsten (W), holmium (Ho), silicon (Si), and oxygen (O). Tungsten is detected only in the tungsten layer and oxygen is detected only at an uppermost surface. This indicates that tungsten is oxidized only at the uppermost surface and is not diffused into the holmium layer as a lower layer.

On the other hand, it is understood that, between the silicon substrate and the holmium layer, silicon is diffused into the holmium layer to form holmium silicide. Therefore, it is understood that silicidation of holmium is achieved in a state where the tungsten layer prevents oxidation of the holmium layer as an under layer. As a result of the analysis, the amount of oxygen mixed into the silicide layer formed of holmium silicide was 1 mass % or less.

Figure 6:
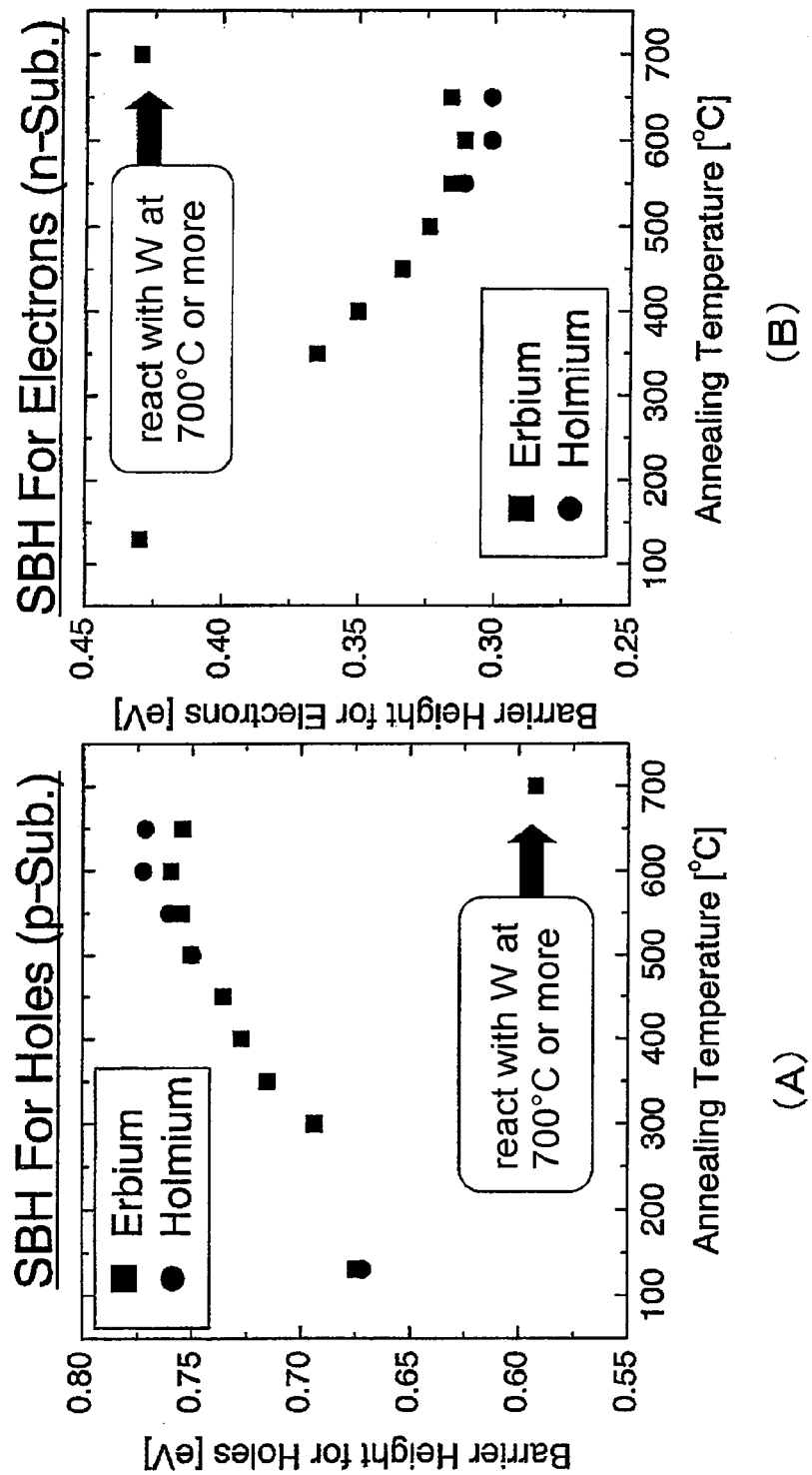
FIG. 6 shows, in (A) and (B), temperature dependency characteristics of Schottky barrier heights (SBH) of a holmium silicide and an erbium silicide when p-type and n-type silicon substrates are used, respectively.

Referring to FIGS. 6 (A) and (B), a relationship between a Schottky barrier height (SBH) and an annealing temperature is shown. FIG. 6 (A) shows the SBHs of erbium (Er) and holmium (Ho) on a p-type silicon substrate with respect to holes. On the other hand, FIG. 6 (B) shows the SBHs of erbium (Er) and holmium (Ho) on an n-type silicon substrate with respect to electrons.

In FIGS. 6 (A) and (B), point-like dots and square dots show characteristics of holmium and erbium, respectively. It is understood that holmium and erbium exhibit generally identical characteristics. As shown in FIG. 6 (A), the SBH with respect to holes is about 0.675 eV at 100° C. and is increased with an elevation of the annealing temperature up to 600° C. to reach 0.75 eV. Further, it is understood that, when the temperature exceeds 650° C. to reach 700° C., the SBH of erbium is decreased down to 0.60 eV. Presumably, this is because erbium reacts with tungsten. When the annealing temperature is elevated, the SBH of holmium becomes slightly higher.

On the other hand, as shown in FIG. 6 (B), it is understood that, in each of erbium and holmium, the SBH with respect to electrons is decreased with an elevation of the annealing temperature and that both of erbium and holmium exhibit generally identical characteristics. Erbium shows the SBH of 0.425 eV at an annealing temperature of about 100° C. and the SBH of 0.30 eV at an annealing temperature of 600° C. It is understood that, at an annealing temperature between 500° C. and 650° C., the SBH of holmium with respect to electrons is lower than the SBH of erbium with respect to electrons. In a case of erbium, when annealing is performed at 700° C., erbium reacts with tungsten and the SBH is increased to 0.425 eV.

Figure 7:
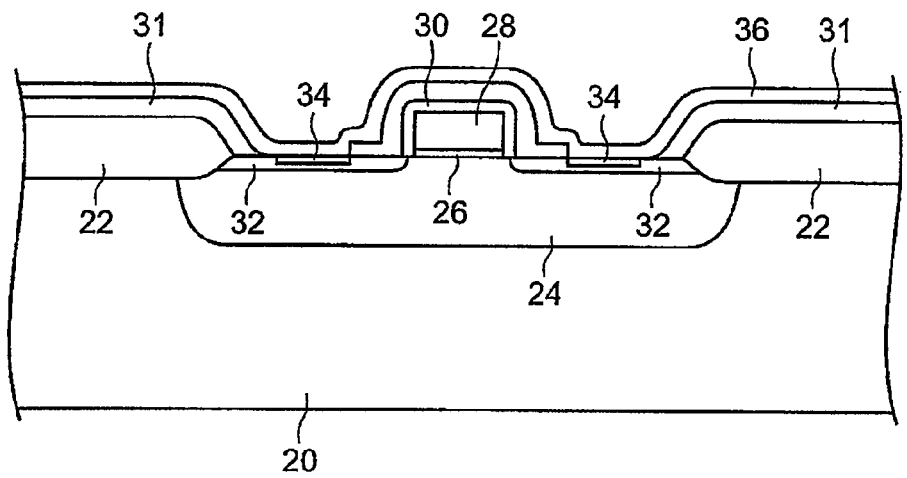
FIG. 7 shows, in (A) and (B), schematic views for describing a structure and a manufacturing process of a semiconductor device according to a first embodiment of the present invention.
Figure 7:
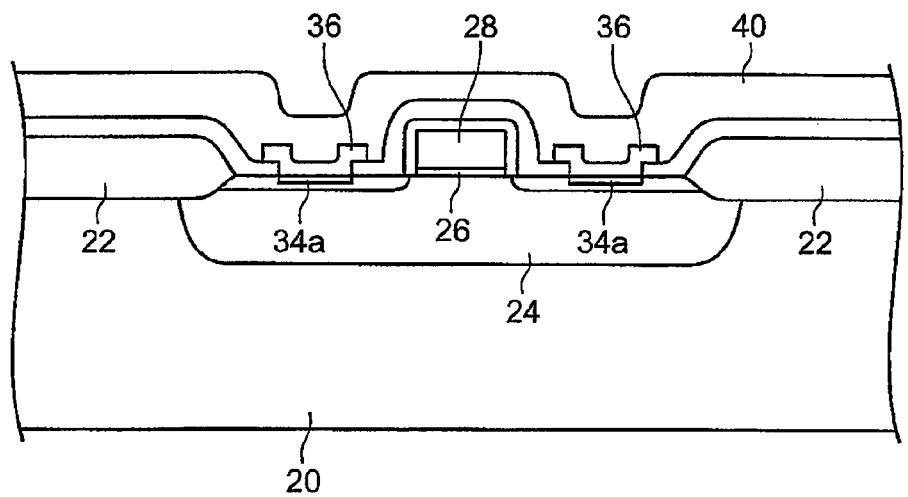

Referring to FIG. 7, a semiconductor device according to a first embodiment of the present invention will be described. Herein, as a semiconductor device according to the present invention, description will be made of an inversion mode n-channel field-effect transistor (MOSFET) by way of example. The first embodiment is characterized in that, when a complicated integrated circuit having a multilayer wiring structure is manufactured, a low-resistance contact is formed in an n-type silicon region by applying the present invention.

As shown in FIG. 7 (A), the n-channel field-effect transistor according to the first embodiment of the present invention is formed in a device region of a silicon substrate 20 which is isolated by a device isolation region 22. As the silicon substrate 20, for example, a p-type silicon substrate is used. In the example illustrated in the figure, a p$^+$ well region 24 is formed in the device region. Within the p$^+$ well region 24, a gate insulating film 26 formed of a silicon oxide film or the like and a gate electrode 28 formed of polysilicon or the like are provided. Although not shown in the figure, a shallow implant region is formed in a region to be a source/drain.

Thereafter, in order to ensure insulation with respect to the gate electrode 28, a side wall 30 comprising a silicon oxide film or a silicon nitride film is formed on the gate insulating film 26 and the gate electrode 28. Subsequently, over the entire surface, an interlayer insulating film 31 of BPSG (Boro-Phospho Silicate Glass) is formed. Thereafter, selective etching is performed to open and expose source/drain regions 32.

Thereafter, ion-implantation of an n-type impurity (herein, arsenic (As)) is performed to form the source/drain regions 32. Subsequently, the implanted impurity is activated by heat treatment. This process may be performed after metal formation which will be described hereinunder. As a result of activation, an impurity concentration of each of the source/drain regions 32 becomes $2 \times 10^{20}$ cm$^{-3}$.

In the first embodiment according to the present invention, a silicon surface of each of the source/drain regions 32 after the ion implantation mentioned above is exposed in a high-purity nitrogen atmosphere in a manner similar to that described in connection with FIG. 1.

On the exposed surface of each of the source/drain regions 32, a low-work-function metal layer 34 is formed in a metal forming device. In this case, for the purpose of minimizing mixture of impurities, sputtering is desirably used as a metal forming method. Herein, by sputtering in an Ar atmosphere, holmium (Ho) is deposited to a thickness of 10 nm. It is noted here that the sputtering atmosphere may be Xe and that Er may be used instead of Ho. As a material of the low-work-function metal layer 34, holmium (Ho) or erbium (Er) is desirable but other rare-earth metals, such as samarium (Sm) and ytterbium (Yb) are also usable, as described above.

For the purpose of reducing the amount of silicon consumption of the silicon substrate 20, a silicide of a rare-earth metal may also be used as a sputtering target.

Specifically, the low-work-function metal layer 34 must be formed of a metal material which forms a metal silicide with the source/drain region 32 and which has, when the source/drain region 32 is of an n-type, a work function whose absolute value is smaller than a value obtained by adding 0.3 eV to an absolute value of an energy level at the bottom of a conduction band of silicon.

After formation of the low-work-function metal layer 34, the silicon substrate 20 is delivered in an inactive gas atmosphere, such as reduced-pressure nitrogen or argon, so as not to be exposed to air, to a second metal film forming chamber where an oxidation-resistant metal layer 36 is formed over the entire exposed surface. Herein, the oxidation-resistant metal layer 36 is formed by using tungsten (W) and by depositing W to a thickness of 300 nm by sputtering in an Ar atmosphere in a sputtering chamber.

Thereafter, the low-work-function metal layer 34 and the oxidation-resistant metal layer 36 are subjected to heat treatment (annealing) at 600° C. in a manner similar to that described in connection with FIG. 1. Thus, a silicide layer 34a of holmium silicide or the like is formed as shown in FIG. 7 (B). Annealing must be performed in an Ar or a N$_2$ atmosphere at 300 to 700° C. for 2 minutes to 60 minutes. Optimum values for both of Ho and Er are 600° C. and about 10 minutes. With these values, Ho or Er is turned into silicide throughout the entire thickness and a barrier height becomes the minimum. At 700° C. or more, reaction with W is caused to occur and the barrier height is rapidly increased.

At this time, by increasing the thickness of the oxidation-resistant metal layer 36 to be greater than that of the low-work-function metal layer 34 as described above, it is possible to reduce a surface roughness of the silicide layer 34a so that breaking of shallow pn junction is prevented. Specifically, it is understood that, if there is no W, Ho (or Er) moves during annealing and therefore defects are caused to occur at an interface with silicon (significant unevenness is generated on a surface of the silicide) while, if there is W, the movement is prevented and defects are not caused to occur. When the thickness of W is 100 nm or more, the above-mentioned effect is obtained. Although a necessary thickness of W depends on a thickness of Ho (or Er), the thickness of the oxidation-resistant metal layer 36 is basically selected so that the surface of the silicide layer 34a has a predetermined flatness.

In FIG. 7 (B), after formation of the silicide layer 34a, the oxidation-resistant metal layer 36 is selectively removed by chemical treatment or plasma etching. In the example shown in FIG. 7 (B), the oxidation-resistant metal layer 36 is left only on the silicide layer 34a and the oxidation-resistant layer 36 on the other region is removed.

Subsequently, a surface oxide film of the oxidation-resistant metal layer 36 is removed and an interlayer insulating film 40 is formed on the entire surface by CVD. The interlayer insulating film 40 in this case may be formed of various kinds of materials. Thereafter, opening of a contact hole and formation of a wiring using Cu, Al, or the like may be carried out by a method same as a manufacturing method usually performed. In this case, the oxidation-resistant metal layer 36 may be removed entirely, including a part on the silicide layer 34a, and a wiring may be formed on the silicide layer directly or via a barrier conductive layer. Obviously, a multilayer wiring layer may be formed further thereon.

In any case, it is possible to obtain a contact having a low resistance of $10^{-9}$ $\Omega cm^2$ or less with respect to the n-type silicon forming the source/drain regions 32.

In the first embodiment, the inversion mode n-channel field-effect transistor has been described. However, the present invention is applicable also to an inversion mode p-channel field-effect transistor.

As described in the foregoing, when the contact is formed in the high-concentration n-type silicon region, it is possible to form a low-resistance contact as compared to a case where the contact is formed in a p-type silicon region. Specifically, in the embodiment shown in FIG. 7, a field-effect transistor capable of substantially reducing a series resistance of the silicon layer is obtained. In this case, a series resistance of a silicon high-concentration layer immediately below the side wall 30 can also be reduced.

Figure 8:
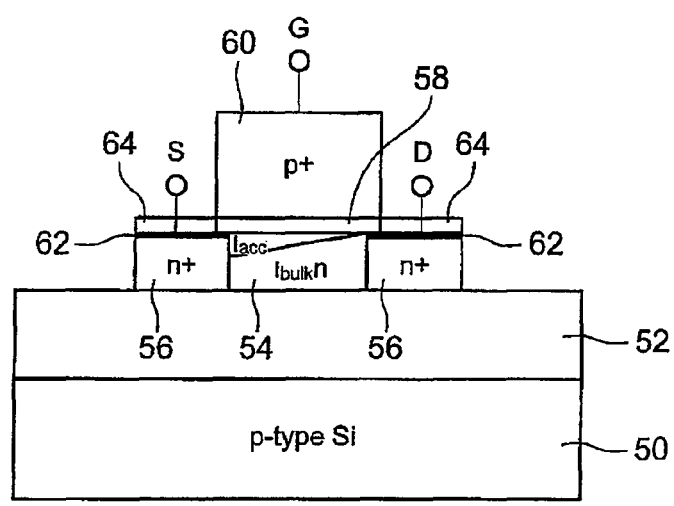
FIG. 8 is a schematic structural view for describing a structure of a semiconductor device according to a second embodiment of the present invention.

Referring to FIG. 8, a semiconductor device according to a second embodiment of the present invention will be described. The semiconductor device illustrated in FIG. 8 is a so-called bulk-current controlled type accumulation mode n-channel transistor.

In the bulk-current controlled type accumulation mode n-channel transistor illustrated in the figure, on a supporting substrate 50 formed of p-type silicon, an n-type semiconductor layer 54 is formed and isolated by a buried oxide film 52 having a thickness of about 100 nm. Herein, the semiconductor layer 54 forms a channel region. A surface of the channel region illustrated in the figure has a (100) orientation. The semiconductor layer 54 has a film thickness of 50 nm. On both sides of the channel region formed of the n-type semiconductor layer 54, source/drain regions 56 are formed each of which has a conductivity type identical with that of the channel region and each of which is formed of an $n^+$ semiconductor having an impurity atomic concentration higher than that of the channel region.

On the channel region formed of the semiconductor layer 54, a gate insulating film 58 formed of an oxide film having an electrically equivalent film thickness (EOT: Equivalent Oxide Thickness) of 7.5 nm is formed. On the gate insulating film 58, a gate electrode 60 of $p^+$ polysilicon is formed. The n-channel transistor illustrated in the figure has a gate length of 0.6 μm and a gate width of 20.0 μm.

Herein, the channel region has an average impurity atomic concentration of $2\times10^{17}$ $cm^{-3}$. Each of the source/drain regions 56 in contact with the channel region is formed of an n-type semiconductor having an impurity concentration of $2\times10^{20}$ $cm^{-3}$.

Like in the first embodiment shown in FIG. 7, each of source and drain electrodes S and D comprises a silicide layer obtained by performing heat treatment in a state where a low-work-function metal layer 62 and an oxidation-resistant metal layer 64 are laminated to thereby silicide the low-work-function metal layer 62.

Herein, as a material of the low-work-function metal layer 62, holmium or erbium is desirable. However, use may be made of a metal material having a work function whose absolute value is smaller than a value obtained by adding 0.3 eV to an absolute value of an energy level at the bottom of a conduction band of $n^+$ silicon forming each of the source/drain regions 56, for example, other rare-earth metals, such as samarium and ytterbium.

According to the second embodiment of the present invention, a contact resistance with a semiconductor is suppressed to $1\times10^{-9}$ $\Omega cm^2$ or less. Even in combination with a series resistance of semiconductor portions of the source/drain regions, a series resistance of the transistor can be reduced to 1.0Ωμm.

In the foregoing, only a case where the present invention is applied to the accumulation mode n-channel transistor has been described. However, the present invention is similarly applicable to an accumulation mode p-channel transistor also.

As described above, the second embodiment of the present invention is applicable to a case where a transistor formed on a SOI (Silicon-On-Insulator) substrate is operated in either an inversion mode or an accumulation mode. However, for the purpose of a high-speed operation, it is desirable to operate the transistor in the accumulation mode.

Figure 9:
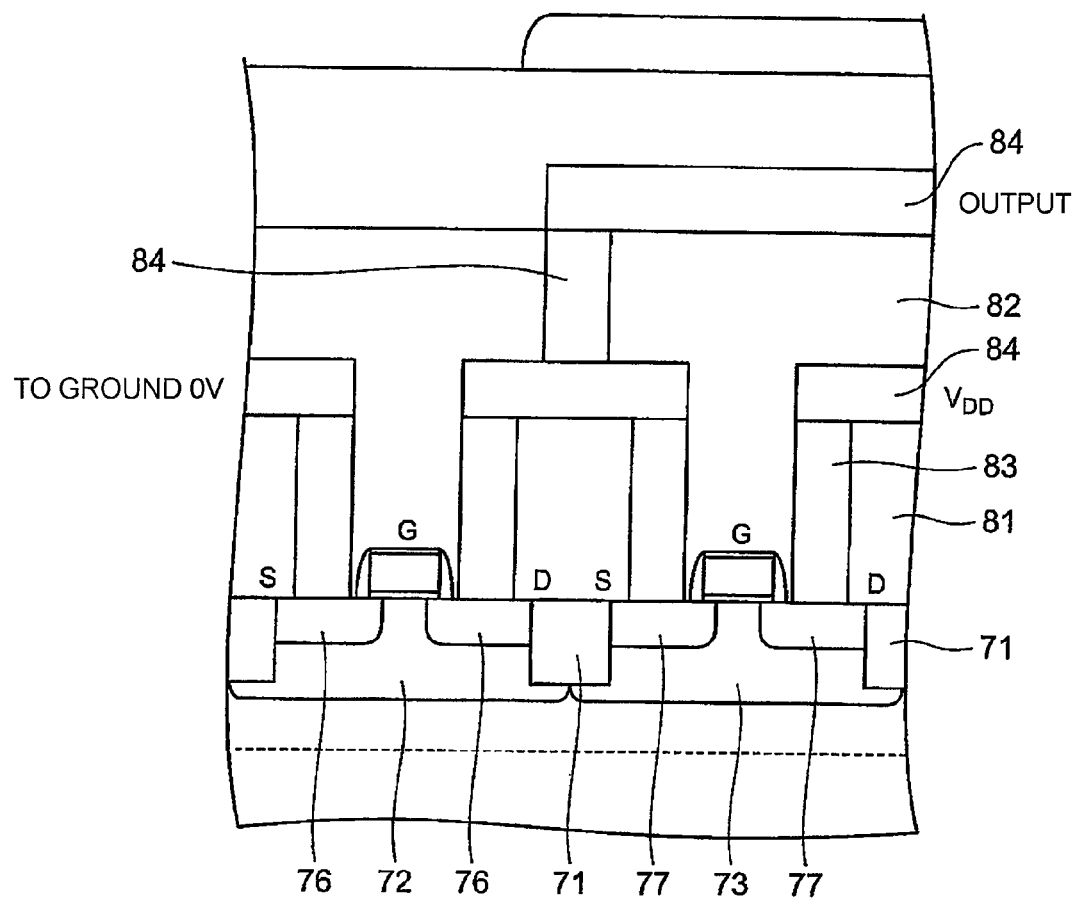
FIG. 9 is a schematic structural view for describing a structure of a semiconductor device according to a third embodiment of the present invention.

Referring to FIG. 9, a semiconductor device according to a third embodiment of the present invention will be described. The semiconductor device illustrated in the figure is a CMOS using device isolation by shallow trench isolation (STI), two-layer wiring, and chemical mechanical polishing (CMP).

A manufacturing process for obtaining the structure shown in FIG. 9 will be described using FIGS. 10 and 11. First, referring to FIG. 10, a device isolation region 71 of a STI structure is formed. After an n-well 72 and a p-well 73 are formed, activation is performed. Subsequently, as a gate insulating film 74, a silicon oxide film is formed to a thickness of 2 nm. On the gate insulating film 74, a gate electrode 75 is formed by using polysilicon.

Next, for the purpose of forming $p^+$ regions 76 and $n^+$ regions 77 in the n-well 72 and the p-well 73, boron and phosphorus are ion-implanted into the n-well 72 and the p-well 73 by $6\times10^{15}$ $cm^2$, respectively. As a consequence, the high-concentration regions 76 ($p^+$ regions) and 77 ($n^+$ regions), each having a thickness of 20 nm, are formed.

Figure 10:
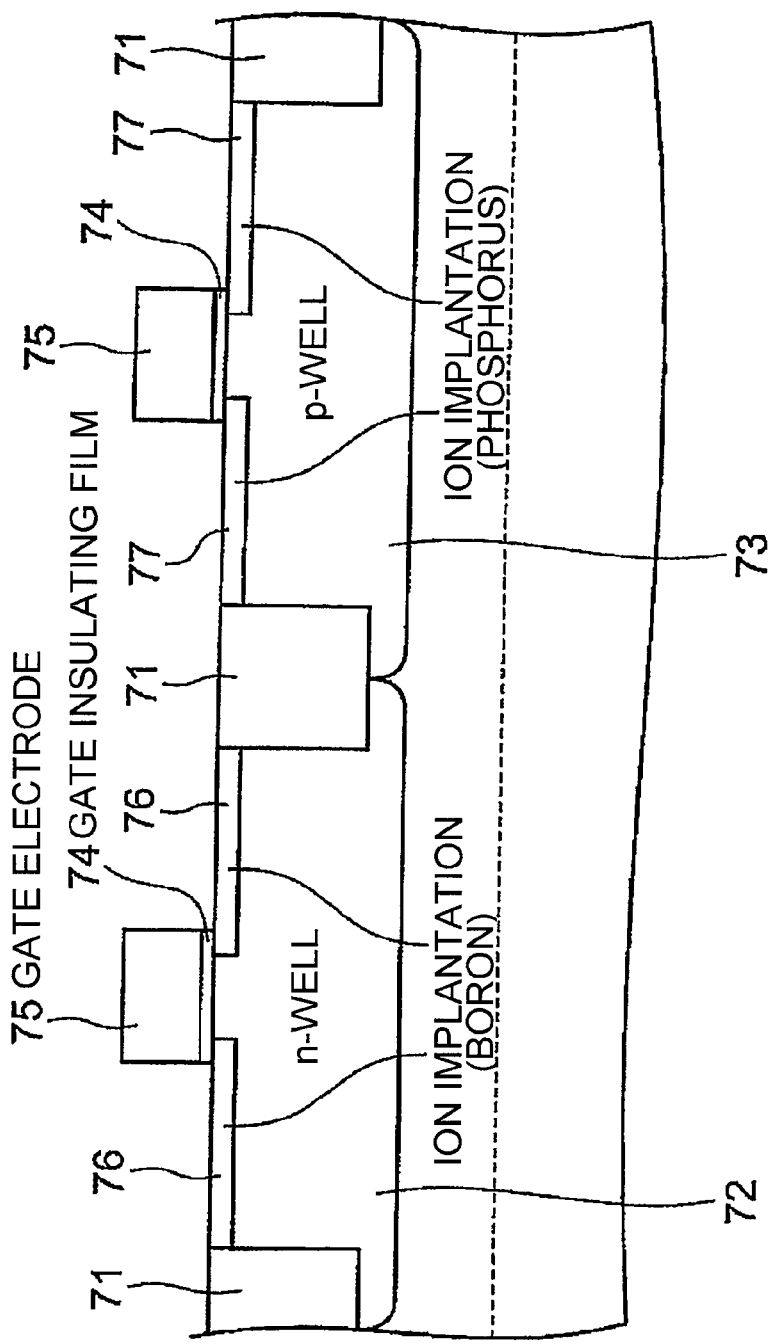
FIG. 10 is a view for describing a manufacturing process of the semiconductor device shown in FIG. 9.
Figure 11:
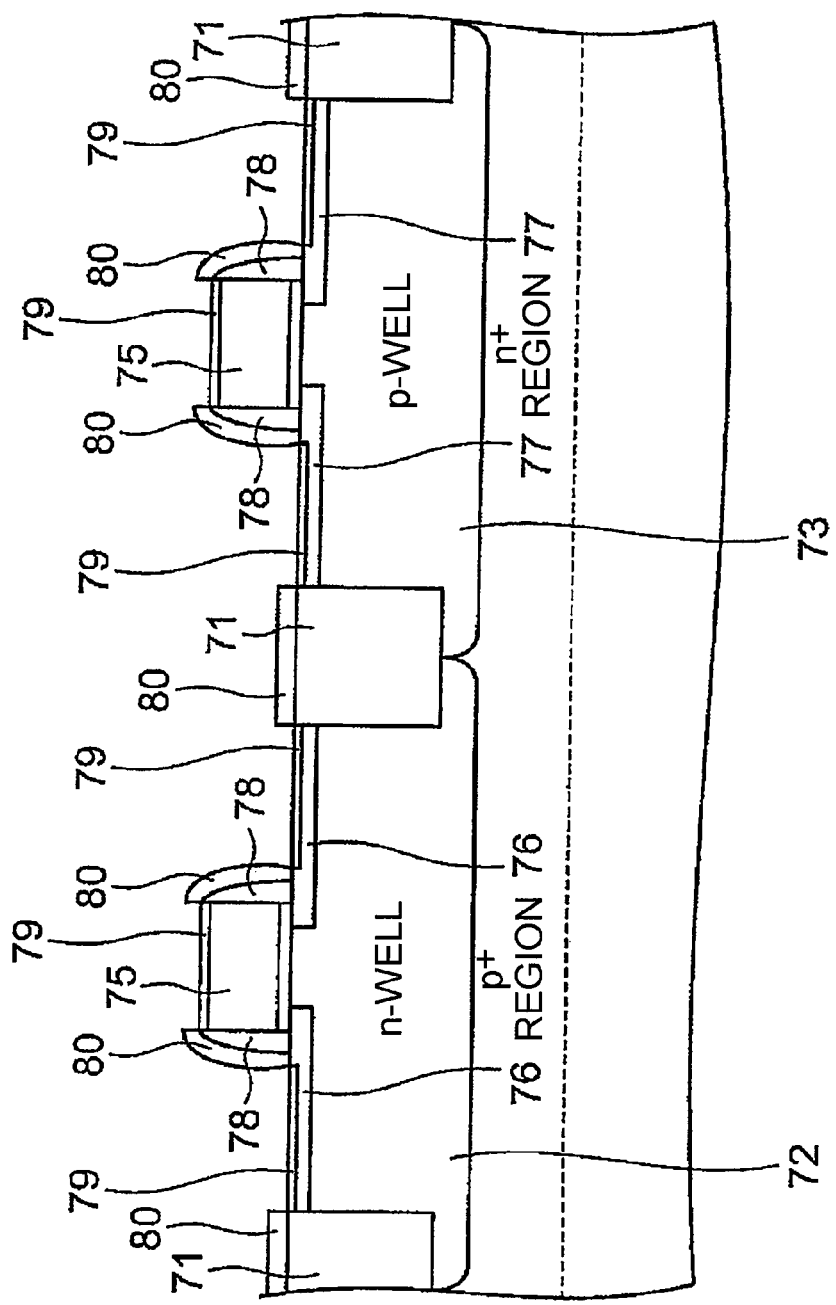
FIG. 11 is a view for describing a process following the process shown in FIG. 10.

FIG. 10 shows a state where the $p^+$ regions 76 and the $n^+$ regions 77 are formed as high-concentration regions in the n-well 72 and the p-well, respectively.

In this state, for the purpose of activation of the high-concentration regions 76 and 77, heat treatment may be performed. However, in this example, without performing heat treatment in this state, an oxide film is deposited by CVD (Chemical Vapor Deposition) and etching is performed to form side walls 78 as shown in FIG. 11. After formation of the side walls 78, as a contact metal for the high-concentration regions 76 and 77 and the gate electrodes 75, low-work-function metal (palladium for the p-channel transistor on the n-well and holmium for the n-channel transistor on the p-well) is deposited to a thickness of 20 nm. Thus, a low-work-function metal layer is formed.

In the third embodiment of the present invention, in a state where the low-work-function metal layer is formed, a tungsten layer is further formed as an oxidation-resistant metal layer. Next, in a state where the low-work-function metal layer and the oxidation-resistant metal layer are laminated, heat treatment is performed in a nitrogen atmosphere at 550° C. for 1 hour. Thus, not only silicidation (formation of a contact silicide layer 79) but also activation of the high-concentration layers 76 and 77, which has not previously been performed, is simultaneously achieved. Because of the heat treatment at a low temperature, diffusion of the high-concentration regions can be suppressed. At this time, palladium and holmium consume silicon of the high-concentration layers 76 and 77 only in an underling part of 13.6 nm, respectively, to form a silicide. Next, the oxidation-resistant metal layer is entirely removed. A schematic view in this state is shown in FIG. 11. Thereafter, unreacted metal portions 80 are removed and, by performing formation of interlayer insulating films 81 and 82, formation of contact holes, and formation of electrodes 83 and wirings 84 by using aluminum, the CMOS having the structure shown in FIG. 9 is completed.

As described above, after the ion-implantation for forming the high-concentration layers is performed, metal deposition is carried out without performing heat treatment for impurity activation. Thereafter, by performing heat treatment, formation of the high-concentration Si layer due to impurity activation and formation of the metal silicide are simultaneously achieved. Thus, it is possible to realize a transistor having a work function difference of 0.3 eV or less and a contact resistivity of $8.0 \times 10^{-10}$ $\Omega cm^2$.

Figure 12:
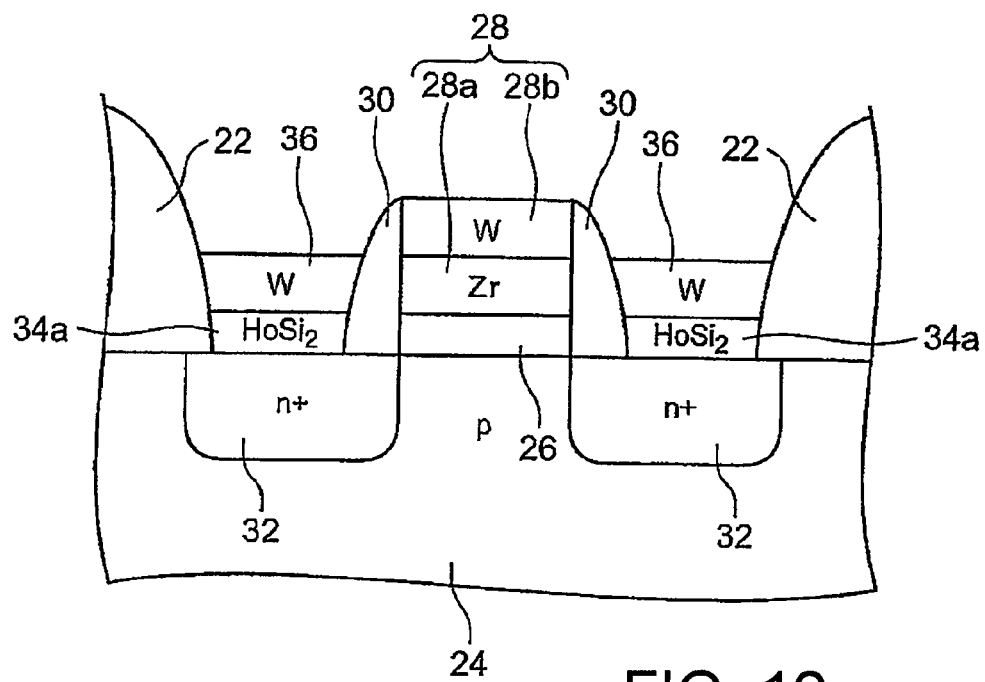
FIG. 12 is a schematic structural view for describing a semiconductor device according to a fourth embodiment of the present invention.

Referring to FIG. 12, a semiconductor device according to a fourth embodiment of the present invention is shown. The semiconductor device illustrated in the figure is an n-channel inversion mode field-effect transistor. Like in FIG. 7, $n^+$ type source/drain regions 32 are formed in a p-well region 24 and, on each of the source/drain regions 32, a low-work-function metal layer formed of holmium and an oxidation-resistant metal layer 36 formed of tungsten are formed. Herein, the low-work-function metal layer is annealed at a temperature of about 600° C. in a state where the oxidation-resistant metal layer 36 is formed. As a consequence, between the oxidation-resistant layer and each of the source/drain regions 32, a contact region comprising a silicide layer 34a (holmium silicide ($HoSi_2$) layer) is formed. In the silicide layer 34a thus formed, the amount of mixed oxygen is 1 mass % or less.

The semiconductor device, namely, the inversion mode field-effect transistor illustrated in the figure is characterized in that a gate electrode 28 formed on a gate insulating film 26 comprises a zirconium (Zr) layer 28a and a tungsten (W) layer 28b. By constituting the gate electrode by the metals as described above, it is possible to reduce a resistance as compared to a case where the gate electrode of the transistor is formed of $n^+$ polysilicon. Further, Zr constituting the zirconium layer 28a has a work function same as that of $n^+$ polysilicon. Furthermore, in the gate electrode 28 shown in the figure, the zirconium layer 28a is covered with the tungsten layer 28b (preferably formed simultaneously with the tungsten layer 36 on source/drain regions) having an oxidation-resistant function. Therefore, it is possible to prevent oxidation of the zirconium layer 28a during annealing.

When the gate electrode is formed by $n^+$ polysilicon, a depletion layer formed along a surface of a channel region becomes thick. This brings about the same disadvantage as that caused in a case where a gate insulating film becomes thick. However, when the gate electrode 28 is formed of a metal layer, such as the zirconium layer 28a, there is an effect that the depletion layer on the surface of the channel region can be reduced in thickness.

Figure 13:
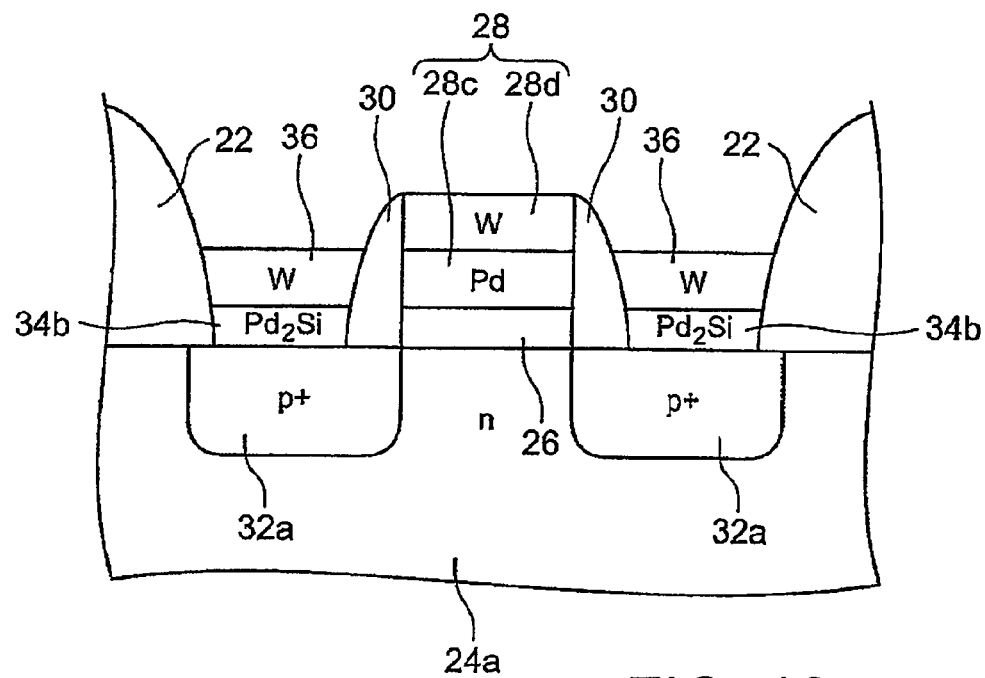
FIG. 13 is a schematic structural view for describing a semiconductor device according to a fifth embodiment of the present invention.

Referring to FIG. 13, a semiconductor device according to a fifth embodiment of the present invention is shown. Herein, a p-channel inversion mode field-effect transistor is shown. In the example illustrated in the figure, $n^+$ source/drain regions 32a are formed in an n-well region 24a. A contact region formed in each of the source/drain regions 32a comprises a palladium silicide ($Pd_2Si$) layer 34b and a tungsten layer 36.

Palladium forming the palladium silicide ($Pd_2Si$) layer 34b is a metal having a work function whose absolute value is greater than a value obtained by subtracting 0.3 eV from an absolute value of an energy level at the top of a valence band of a p-type semiconductor forming the $p^+$ source/drain regions 32a. Therefore, it is possible to form a low-resistance contact region. Further, the palladium silicide layer 34b is covered with the tungsten layer 36 having a function as an oxidation-resistant metal layer. Therefore, the amount of mixed oxygen is 1 mass % or less.

Further, the p-channel transistor illustrated in the figure has a gate electrode 28 having a structure comprising a palladium layer 28c and a tungsten layer 28d formed on a gate insulating film 26. Side surfaces of the gate insulating film 26 and the gate electrode 28 are covered with side walls 30. As described above, as the gate electrode 28, the palladium layer 28c is formed which is a metal having a work function same as that of $p^+$ polysilicon and a lower resistance. Therefore, as compared to a case where the gate electrode is formed of $p^+$ polysilicon, it is possible to reduce a resistance and to reduce a thickness of a depletion layer.

Figure 14:
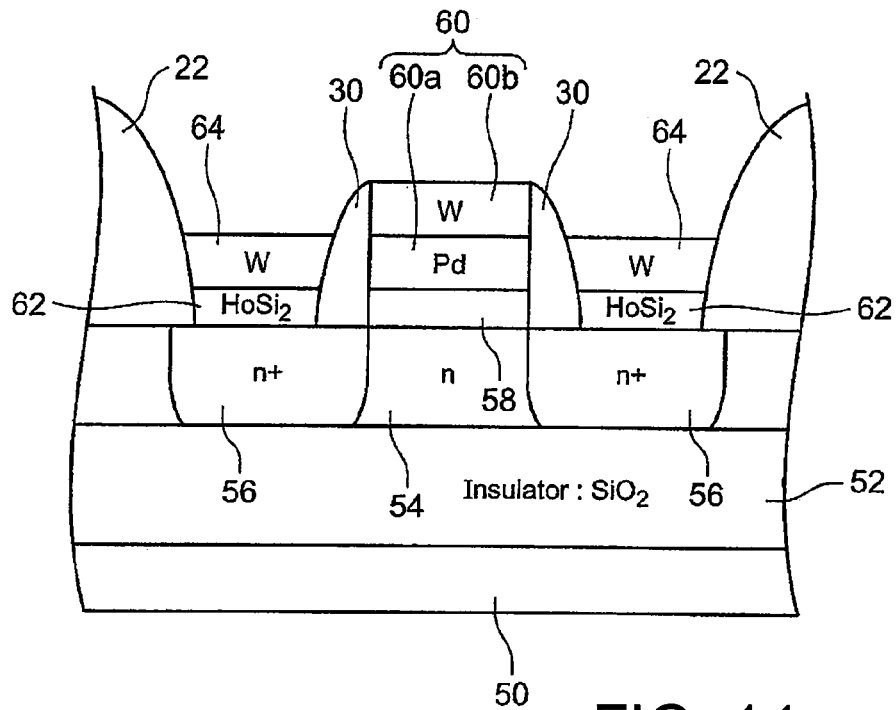
FIG. 14 is a schematic structural view for describing a semiconductor device according to a sixth embodiment of the present invention.

Referring to FIG. 14, a semiconductor device according to a sixth embodiment of the present invention is shown. Herein, an n-channel accumulation mode field-effect transistor is shown. The transistor illustrated in the figure has an n-type semiconductor layer (specifically, an n-type silicon layer) 54 isolated by a buried oxide film ($SiO_2$) 52 formed on a supporting substrate 50 of p-type silicon or the like. The semiconductor layer 54 forms a channel region. The semiconductor layer 54 forming the channel region is provided, on both sides thereof, with source/drain regions 56 each of which is formed of an $n^+$ semiconductor having a conductivity type identical with that of the channel region and an impurity atomic concentration higher than that of the channel region.

On a surface of each of the source/drain regions 56, a contact region is formed. In the example shown in the figure, the contact region comprises a holmium silicide layer 62 and a tungsten layer 64. This structure is obtained by performing annealing in a state where the holmium layer as a low-work-function metal layer is covered with the tungsten layer as an oxidation-resistant metal layer, like in the other embodiments.

In the example shown in the figure, a gate insulating film 58 and a gate electrode 60 are formed on the n-type semiconductor layer 54 forming the channel region. The gate electrode 60 comprises a palladium layer 60a and a tungsten layer 60b.

The gate electrode 60 shown in FIG. 14 includes the palladium layer 60a having a work function same as that of $p^+$ silicon and a resistance lower than that of $p^+$ silicon. This makes it possible to increase the thickness of a depletion layer along the surface of the channel region and, as a result, to realize a normally off state. Further, since the palladium layer 60a is covered with the tungsten layer 60b which is the oxidation-resistant metal layer, it is possible to prevent oxidation of the palladium layer 60a.

Figure 15:
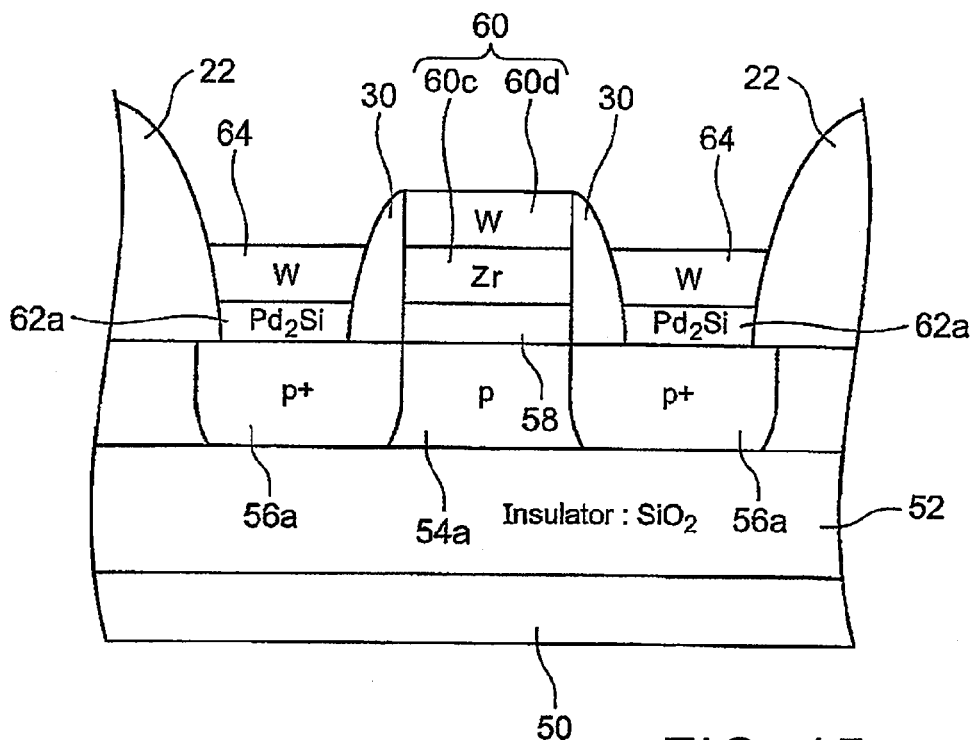
FIG. 15 is a schematic structural view for describing a semiconductor device according to a seventh embodiment of the present invention.

Referring to FIG. 15, a semiconductor device according to a seventh embodiment of the present invention is shown. The example shown in the figure is a p-channel accumulation mode field-effect transistor. As apparent from the figure, on a silicon substrate which is a supporting substrate 50, a buried oxide film ($SiO_2$) 52 is formed. On the buried oxide film 52, a p-type semiconductor layer 54a is formed. On both sides of the p-type semiconductor layer 54a, $p^+$ source/drain regions 56a are formed.

A contact region in this example comprises a palladium silicide ($Pd_2Si$) layer 62a and a tungsten layer 64. The contact region shown in the figure is also obtained by performing annealing in a state where the palladium layer as a low-work-function metal layer is covered with the tungsten layer, as described above. With this structure, it is possible to remarkably reduce a resistance of the contact region, like in the other embodiments.

Further, on the channel region, a gate insulating film 58 is formed and, on the gate insulating film 58, a gate electrode 60 comprising a zirconium layer 60c and a tungsten layer 60d is formed.

With this structure also, a resistance of the gate electrode 60 can be reduced as compared to a case where polysilicon is used. Like in FIG. 14, a depletion layer formed within the channel region can be increased in thickness.

In the cases of the n-channel transistors shown in FIGS. 12 and 14, for the purpose of forming the contact region with the n+ semiconductor, holmium (Ho) is used as the low-work-function metal layer. On the other hand, in the cases of the p-channel transistors shown in FIGS. 13 and 15, for the purpose of forming the contact region with the p+ semiconductor, palladium (Pd) is used. Thus, in view of a work function difference from each of the n+ semiconductor and the p+ semiconductor, a metal of the low-work-function metal layer forming the silicide layer of the contact region can be selected.

As regards the gate electrode, zirconium is used in FIGS. 12 and 15 while palladium is used in FIGS. 13 and 14. Thus, regarding the gate electrode also, a metal constituting the gate electrode can be selected depending on the work function difference from the semiconductor forming the channel region.

INDUSTRIAL APPLICABILITY

In the present invention, by performing annealing in a state where the low-work-function metal layer is covered with the oxidation-resistant metal layer, it is possible to form the silicide layer having an extremely low resistance. Therefore, a high-performance semiconductor device can be constructed. Further, the present invention is applicable not only to a MOSFET but also to other various types of semiconductor devices having a contact region.

Description Of Reference Numerals
    100 silicon substrate
    120 semiconductor-side electrode
    10 low-work-function metal layer
    12 oxidation-resistant metal layer
    101 insulating film
    102 opening portion
    20 silicon substrate
    22 device isolation region
    24 well
    26 gate insulating film
    28 gate electrode
    30 side wall
    31 interlayer insulating film
    32 source/drain region
    34 low-work-function metal layer
    34a silicide layer
    36 oxidation-resistant metal layer
    40 interlayer insulating film
    50 silicon substrate
    52 buried oxide film
    54 semiconductor layer
    56 source/drain region
    58 gate insulating film
    62 low-work-function metal layer
    64 oxidation-resistant metal layer
    71 device isolation region
    72 n-well
    73 p-well
    74 gate insulating film
    75 gate electrode
    76 high-concentration region (p+ region)
    77 high-concentration region (n+ region)
    78 side wall
    80 unreacted metal portion
    79 silicide layer
    81, 82 interlayer insulating film
    83 electrode
    84 wiring

The invention claimed is:

1. A method of forming a contact of a metal semiconductor compound on a predetermined region of a semiconductor device, comprising the steps of:
    selecting a first metal in relation to a semiconductor type of the predetermined region;
    forming a layer of the first metal on the predetermined region;
    forming, on the layer of the first metal, a layer of a second metal for preventing oxidation of the first metal; and
    compounding only the first metal with a semiconductor by heat treatment while the first metal is covered with the layer of the second metal, to thereby form the contact of the metal semiconductor compound which has a contact resistance of $10^{-9} \Omega \text{cm}^2$ or less;
    wherein, when the predetermined region is an n-type semiconductor region, the first metal is selected from a metal which has a work function whose absolute value is smaller than a value obtained by adding 0.3 eV to an absolute value of an energy level at the bottom of a conduction band of the semiconductor;
    wherein, when the predetermined region is a p-type semiconductor region, the first metal is selected from a metal which has a work function whose absolute value is greater than a value obtained by subtracting 0.3 eV from an absolute value of an energy level at the top of a valence band of the semiconductor; and
    wherein the second metal is of tungsten while the layer of the second metal has a thickness between 50 nm and 300 nm.

2. A semiconductor device manufacturing method comprising the steps of:
    forming a layer of a first metal at a silicon portion to be a p-type or an n-type contact region of a semiconductor device;
    forming, on the layer of the first metal, a layer of a second metal for preventing oxidation of the first metal; and
    forming a silicide of the first metal by reacting only the first metal with the silicon portion while the first metal is covered with the layer of the second metal to thereby form the silicide of the first metal with the silicon which has a contact resistance of $10^{-9} \Omega \text{cm}^2$ or less;
    wherein:
    when the contact region is of an n-type, a metal which is selected and used as the first metal has a work function whose absolute value is smaller than a value obtained by adding 0.3 eV to an absolute value of an energy level at the bottom of a conduction band of silicon, and
    wherein:
    when the contact region is of a p-type, the metal which is selected and used as the first metal has a work function whose absolute value is greater than a value obtained by subtracting 0.3 eV from an absolute value of an energy level at the top of a valence band of silicon;

wherein the second metal is of tungsten while the thickness of the second metal has a thickness between 50 nm and 300 nm.

3. The semiconductor device manufacturing method as claimed in claim 2, further comprising a step of forming a conductive material layer in contact with the layer of the second metal.

4. The semiconductor device manufacturing method as claimed in claim 2, wherein the contact region is formed on a source or a drain region of a field-effect transistor.

5. The semiconductor device manufacturing method as claimed in claim 2, wherein the contact region is a p-type region and the first metal is palladium.

6. The semiconductor device manufacturing method as claimed in claim 2, wherein the second metal has a thickness selected so that an interface between the silicide and the silicon portion has a predetermined roughness.

7. The semiconductor device manufacturing method as claimed in claim 2, wherein the second metal is tungsten.

8. The semiconductor device manufacturing method as claimed in claim 2, further comprising a step of removing at least a part of the layer of the second metal after the step of forming a silicide of the first metal.

9. The semiconductor device manufacturing method as claimed in claim 8, further comprising a step of forming a conductive material layer in contact with a silicide layer of the first metal after the removing step.

10. The semiconductor device manufacturing method as claimed in claim 2, wherein the first metal is a rare-earth metal.

11. The semiconductor device manufacturing method as claimed in claim 10, wherein the contact region is an n-type region and the first metal is holmium or erbium.

12. The semiconductor device manufacturing method as claimed in claim 2, comprising a step of cleaning a surface of the silicon portion to be the contact region;
wherein the layer of the first metal is formed by a first metal film forming apparatus while the layer of the second metal is formed by a second metal film forming apparatus, and
wherein a carrying-in step into the first metal film forming apparatus is executed after the surface of the silicon portion to be the contact region is cleaned in the cleaning step and a carrying-in step into the second metal film forming apparatus is executed after forming the layer of the first metal in the first metal film forming apparatus;
both the carrying-in steps being performed without being exposed to air.

13. The semiconductor device manufacturing method as claimed in claim 12, wherein the carrying-in step into the first metal film forming apparatus executed after the surface of the silicon portion to be the contact region is cleaned in the cleaning step and the carrying-in step into the second metal film forming device executed after forming the layer of the first metal in the first metal film forming apparatus are performed in a nitrogen gas or an inactive gas atmosphere.

14. A semiconductor device comprising:
a silicide layer of a silicide of a first metal formed on a surface of a silicon portion as a p-type or an n-type contact region of the semiconductor device; and
a layer of a second metal formed on the silicide layer to prevent oxidation of the first metal;
wherein, when the contact region is of the n-type, the silicide layer is formed by the first metal which has a work function whose absolute value is smaller than a value obtained by adding 0.3 eV to an absolute value of an energy level at the bottom of a conduction band of silicon,
wherein, when the contact region is of the p-type, the silicide layer is formed by the first metal which has a work function whose absolute value is greater than a value obtained by subtracting 0.3 eV from an absolute value of an energy level at the top of a valence band of silicon; and
wherein the silicide layer has a contact resistance of $10^{-9} \Omega cm^2$ or less;
wherein the second metal is of tungsten while the layer of the second metal has a thickness between 50 nm and 300 nm.

15. The semiconductor device as claimed in claim 14, comprising a conductive material layer formed in contact with the layer of the second metal.

16. The semiconductor device as claimed in claim 14, wherein the amount of mixed oxygen in the silicide layer is 1 mass % or less.

17. A semiconductor device comprising a silicide layer of a silicide of a first metal formed on a surface of a silicon portion as a p-type or an n-type contact region of the semiconductor device;
wherein:
when the contact region is of the n-type, the silicide layer is formed by the first metal which has a work function whose absolute value is smaller than a value obtained by adding 0.3 eV to an absolute value of an energy level at the bottom of a conduction band of silicon,
wherein:
when the contact region is of the p-type, the silicide layer is formed by the first metal which has a work function whose absolute value is greater than a value obtained by subtracting 0.3 eV from an absolute value of an energy level at the top of a valence band of silicon;
wherein the amount of mixed oxygen in the silicide layer is 1 mass% or less; and
wherein the silicide layer has a contact resistance of $10^{-9} \Omega cm^2$ or less.

18. The semiconductor device as claimed in claim 17, comprising a conductive material layer formed in contact with the silicide layer.

19. The semiconductor device as claimed in claim 14 or 17, wherein the first metal is a rare-earth metal.

20. The semiconductor device as claimed in claim 14 or 17, wherein the contact region is the n-type region and the first metal is holmium.

21. The semiconductor device as claimed in claim 14 or 17, wherein the contact region is the n-type region and the first metal is erbium.

22. The semiconductor device as claimed in claim 14 or 17, wherein the contact region is the p-type region and the first metal is palladium.

23. The semiconductor device as claimed in claim 14 or 17, wherein the second metal has a thickness selected so that an interface between the silicide and the silicon portion has a predetermined roughness.

24. The semiconductor device as claimed in claim 14 or 17, wherein the second metal is tungsten.

25. The semiconductor device as claimed in claim 14 or 17, wherein the contact region is one or both of source and drain regions of a field-effect transistor.

26. The semiconductor device as claimed in claim 25, wherein the field-effect transistor is an inversion mode n-channel transistor.

27. The semiconductor device as claimed in claim 25, wherein the field-effect transistor is an accumulation mode n-channel transistor.

28. The semiconductor device as claimed in claim 25, wherein the field-effect transistor is an inversion mode p-channel transistor.

29. The semiconductor device as claimed in claim 25, wherein the field-effect transistor is an accumulation mode p-channel transistor.

30. The semiconductor device as claimed in claim 25, wherein the field-effect transistor has a gate electrode which comprises a layer of a third metal and the layer of the second metal formed on the layer of the third metal.

31. The semiconductor device as claimed in claim 30, wherein the third metal is zirconium.

32. The semiconductor device as claimed in claim 30, wherein the third metal is palladium.

33. An n-MOS transistor comprising a source electrode and a drain electrode each of which includes a laminated structure comprising a holmium silicide layer and a tungsten layer formed thereon and each of which is formed on an n-type silicon region
wherein the holmium silicide layer has a contact resistance of $10^{-9} \Omega cm^2$ or less; and
wherein the tungsten layer has a thickness such that the holmium silicide layer has a predetermined flatness.

34. A CMOS semiconductor device including the n-MOS transistor claimed in claim 33 and a p-MOS transistor comprising a source electrode and a drain electrode each of which includes a laminated structure comprising a palladium silicide layer and a tungsten layer formed thereon and each of which is formed on a p-type silicon region;
wherein the palladium silicide layer has a contact resistance of $10^{-9} \Omega cm^2$ or less.

35. A p-MOS transistor comprising a source electrode and a drain electrode each of which includes a laminated structure comprising a palladium silicide layer and a tungsten layer formed thereon and each of which is formed on a p-type silicon region;
wherein the palladium silicide layer has a contact resistance of $10^{-9} \Omega cm^2$ or less;
wherein the tungsten layer has a thickness such that the palladium silicide layer has predetermined flatness.

36. A CMOS semiconductor device comprising an n-MOS transistor and a p-MOS transistor, the n-MOS transistor comprising a source electrode and a drain electrode each of which includes a laminated structure comprising a holmium silicide layer and a tungsten layer formed thereon and each of which is formed on an n-type silicon region, the p-MOS transistor comprising a source electrode and a drain electrode each of which includes a palladium silicide layer and each of which is formed on a p-type silicon region
wherein each of the holmium silicide layer and the palladium silicide layer has a contact resistance of $10^{-9} \Omega cm^2$ or less.

37. The CMOS semiconductor device as claimed in claim 36 or 34, wherein the n-MOS transistor and the p-MOS transistor are connected in series to each other.

38. An inversion mode n-MOS transistor comprising a gate electrode which includes a laminated structure comprising a zirconium layer and a tungsten layer formed thereon and which is formed on a gate insulating film; and
a source electrode and a drain electrode each of which includes a laminated structure comprising a holmium silicide layer and a tungsten layer formed thereon and each of which is formed on an n-type silicon region;
wherein the holmium silicide layer has a contact resistance of $10^{-9} \Omega cm^2$ or less; and
wherein the tungsten layer has a thickness such that the holmium silicide layer has a predetermined flatness.

39. An accumulation mode p-MOS transistor comprising a gate electrode which includes a laminated structure comprising a zirconium layer and a tungsten layer formed thereon and which is formed on a gate insulating film; and
a source electrode and a drain electrode each of which includes a laminated structure comprising a palladium silicide layer and a tungsten layer formed thereon and each of which is formed on a p-type silicon region;
wherein the palladium silicide layer has a contact resistance of $10^{-9} \Omega cm^2$ or less; and
wherein the tungsten layer on the palladium silicide layer has a thickness such that the holmium silicide layer has a predetermined flatness.

40. An inversion mode p-MOS transistor comprising a gate electrode which includes a laminated structure comprising a palladium layer and a tungsten layer formed thereon and which is formed on a gate insulating film; and
a source electrode and a drain electrode each of which includes a laminated structure comprising a palladium silicide layer and a tungsten layer formed thereon and each of which is formed on a p-type silicon region;
wherein the palladium silicide layer has a contact resistance of $10^{-9} \Omega cm^2$ or less; and
wherein the tungsten layer on the palladium silicide layer has a thickness such that the holmium silicide layer has a predetermined flatness.

41. An accumulation mode n-MOS transistor comprising a gate electrode which includes a laminated structure comprising a palladium layer and a tungsten layer formed thereon and which is formed on a gate insulating film; and
a source electrode and a drain electrode each of which includes a laminated structure comprising a holmium silicide layer and a tungsten layer formed thereon and each of which is formed on an n-type silicon region;
wherein the holmium silicide layer has a contact resistance of $10^{-9} \Omega cm^2$ or less; and
wherein the tungsten layer on the holmium silicide layer has a thickness such that the holmium silicide layer has a predetermined flatness.

42. A CMOS semiconductor device including the n-MOS transistor claimed in claim 38 or 41 and an inversion mode p-MOS transistor comprising:
a gate electrode which includes a laminated structure comprising a palladium layer and a tungsten layer formed thereon and which is formed on a gate insulating film; and
a source electrode and a drain electrode each of which includes a single layer structure of palladium silicide or a laminated structure comprising a palladium silicide layer and a tungsten layer formed thereon and each of which is formed in a p-type silicon region;
wherein the palladium silicide layer has a contact resistance of $10^{-9} \Omega cm^2$ or less.

43. A CMOS semiconductor device including the n-MOS transistor claimed in claim 38 or 41 and an accumulation mode p-MOS transistor comprising a gate electrode which includes a laminated structure comprising a zirconium layer and a tungsten layer formed thereon and which is formed on a gate insulating film.

44. The CMOS semiconductor device as claimed in claim 43, wherein the n-MOS transistor and the p-MOS transistor are connected in series to each other.

45. An inversion mode n-MOS transistor comprising a gate electrode which includes a laminated structure comprising a zirconium layer and a tungsten layer formed thereon and which is formed on a gate insulating film, and a source electrode and a drain electrode each of which includes a laminated structure comprising a holmium silicide layer and a tungsten layer formed thereon and each of which is formed in an n-type silicon region
 wherein the holmium silicide layer has a contact resistance of $10^{-9} \Omega cm^2$ or less; and
 wherein the tungsten layer on the holmium silicide layer has a thickness such that the holmium silicide layer has a predetermined flatness.

46. An accumulation mode p-MOS transistor comprising:
a gate electrode which includes a laminated structure comprising a zirconium layer and a tungsten layer formed thereon and which is formed on a gate insulating film, and
a source electrode and a drain electrode each of which includes a single layer structure of palladium silicide or a laminated structure comprising a palladium silicide layer and a tungsten layer formed thereon and each of which is formed in a p-type silicon region;
 wherein the palladium silicide layer has a contact resistance of $10^{-9} \Omega cm^2$ or less; and
 wherein the tungsten layer on the palladium silicide layer has a thickness such that the palladium silicide layer has a predetermined flatness.

47. An inversion mode p-MOS transistor comprising:
a gate electrode which includes a laminated structure comprising a palladium layer and a tungsten layer formed thereon and which is formed on a gate insulating film, and
a source electrode and a drain electrode each of which includes a single layer structure of palladium silicide or a laminated structure comprising a palladium silicide layer and a tungsten layer formed thereon and each of which is formed in a p-type silicon region;
 wherein the palladium silicide layer has a contact resistance of $10^{-9} \Omega cm^2$ or less: and
 wherein the tungsten layer on the palladium silicide layer has a thickness such that the palladium silicide layer has a predetermined flatness.

48. An accumulation mode n-MOS transistor comprising:
a gate electrode which includes a laminated structure comprising a palladium layer and a tungsten layer formed thereon and which is formed on a gate insulating film, and
a source electrode and a drain electrode each of which includes a laminated structure comprising a holmium silicide layer and a tungsten layer formed thereon and each of which is formed in an n-type silicon region;
 wherein the holmium silicide layer has a contact resistance of $10^{-9} \Omega cm^2$ or less; and
 wherein the tungsten layer on the holmium silicide layer has a thickness such that the holmium silicide layer has a predetermined flatness.

49. A CMOS semiconductor device including the n-MOS transistor claimed in claim 45 or 48 and an inversion mode p-MOS transistor comprising:
a gate electrode which includes a laminated structure comprising a palladium layer and a tungsten layer formed thereon and which is formed on a gate insulating film, and
a source electrode and a drain electrode each of which includes a single layer structure of palladium silicide or a laminated structure comprising a palladium silicide layer and a tungsten layer formed thereon and each of which is formed in a p-type silicon region;
 wherein the palladium silicide layer has a contact resistance of $10^{-9} \Omega cm^2$ or less.

50. A CMOS semiconductor device including the n-MOS transistor claimed in claim 45 or 48 and an accumulation mode p-MOS transistor comprising:
a gate electrode which includes a laminated structure comprising a zirconium layer and a tungsten layer formed thereon and which is formed on a gate insulating film, and
a source electrode and a drain electrode each of which includes a single layer structure of palladium silicide or a laminated structure comprising a palladium silicide layer and a tungsten layer formed thereon and each of which is formed in a p-type silicon region
 wherein the palladium silicide layer has a contact resistance of $10^{-9} \Omega cm^2$ or less.

51. The CMOS semiconductor device as claimed in claim 50, wherein the n-MOS transistor and the p-MOS transistor are connected in series to each other.

* * * * *